(12) United States Patent
Ma et al.

(10) Patent No.: US 9,831,866 B2
(45) Date of Patent: Nov. 28, 2017

(54) SWITCHING CIRCUIT

(71) Applicant: Nanyang Technological University, Singapore (SG)

(72) Inventors: Kaixue Ma, Singapore (SG); Shou Xian Mou, Singapore (SG); Kiat Seng Yeo, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/889,726

(22) PCT Filed: May 12, 2014

(86) PCT No.: PCT/IB2014/000708
§ 371 (c)(1),
(2) Date: Nov. 6, 2015

(87) PCT Pub. No.: WO2014/181172
PCT Pub. Date: Nov. 13, 2014

(65) Prior Publication Data
US 2016/0126945 A1    May 5, 2016

Related U.S. Application Data

(60) Provisional application No. 61/821,741, filed on May 10, 2013, provisional application No. 61/822,946, filed on May 14, 2013.

(51) Int. Cl.
*H03K 17/76* (2006.01)
*H03K 17/687* (2006.01)
(Continued)

(52) U.S. Cl.
CPC ............ *H03K 17/687* (2013.01); *H03H 7/48* (2013.01); *H03K 17/76* (2013.01); *H04B 1/38* (2013.01); *H03H 7/465* (2013.01)

(58) Field of Classification Search
CPC ...... H01P 1/10; H01P 1/15; H01P 1/22; H01P 1/213; H01P 3/02; H01P 5/12;
(Continued)

(56) References Cited

U.S. PATENT DOCUMENTS 5,646,582 A    7/1997  Kawasaki
6,552,626 B2   4/2003  Sharpe et al.
(Continued)

*Primary Examiner* — Shawkat M Ali
(74) *Attorney, Agent, or Firm* — K. David Crockett, Esq.; Niky Economy Syrengelas, Esq.; Crockett & Crockett, PC

(57) ABSTRACT

According to embodiments of the present invention, a switching circuit is provided. The switching circuit includes a transmission line arrangement including a plurality of transmission lines coupled to each other, and at least one switching element arrangement coupled to at least one transmission line of the plurality of transmission lines, wherein, in a first mode of operation, the at least one switching element arrangement is configured in a first state, wherein, in a second mode of operation, the at least one switching element arrangement is configured in a second state, and wherein the transmission line arrangement is configured to, depending on whether the at least one switching element arrangement is configured in the first state or the second state, generate a standing wave from an input signal received by the transmission line arrangement for coupling into an output signal, wherein the output signal is transmitted from the transmission line arrangement.

20 Claims, 14 Drawing Sheets

(51) Int. Cl.
*H03H 7/48* (2006.01)
*H04B 1/38* (2015.01)
*H03H 7/46* (2006.01)

(58) Field of Classification Search
CPC ............ H03K 3/00; H03K 3/01; H03K 17/76;
H03K 17/687; H04B 1/28; H04B 1/38;
H04B 1/44; H04L 5/14
USPC ........ 327/308, 427, 534; 333/103, 104, 126,
333/202; 370/276; 375/219; 455/78,
455/333
See application file for complete search history.

(56) References Cited

U.S. PATENT DOCUMENTS

| | | | |
|---|---|---|---|
| 6,987,414 B2 | 1/2006 | Numata | |
| 7,659,770 B2 | 2/2010 | Teraguchi et al. | |
| 7,688,765 B2 | 3/2010 | Kim | |
| 7,755,173 B2 | 7/2010 | Mondi et al. | |
| 2003/0030509 A1* | 2/2003 | Veenstra | H04Q 3/521 333/103 |
| 2007/0024389 A1* | 2/2007 | Mizutani | H01P 1/15 333/104 |
| 2009/0152739 A1 | 6/2009 | Rofougaran et al. | |
| 2010/0097119 A1* | 4/2010 | Ma | H01P 1/15 327/427 |
| 2010/0231236 A1 | 9/2010 | Harrison | |

\* cited by examiner

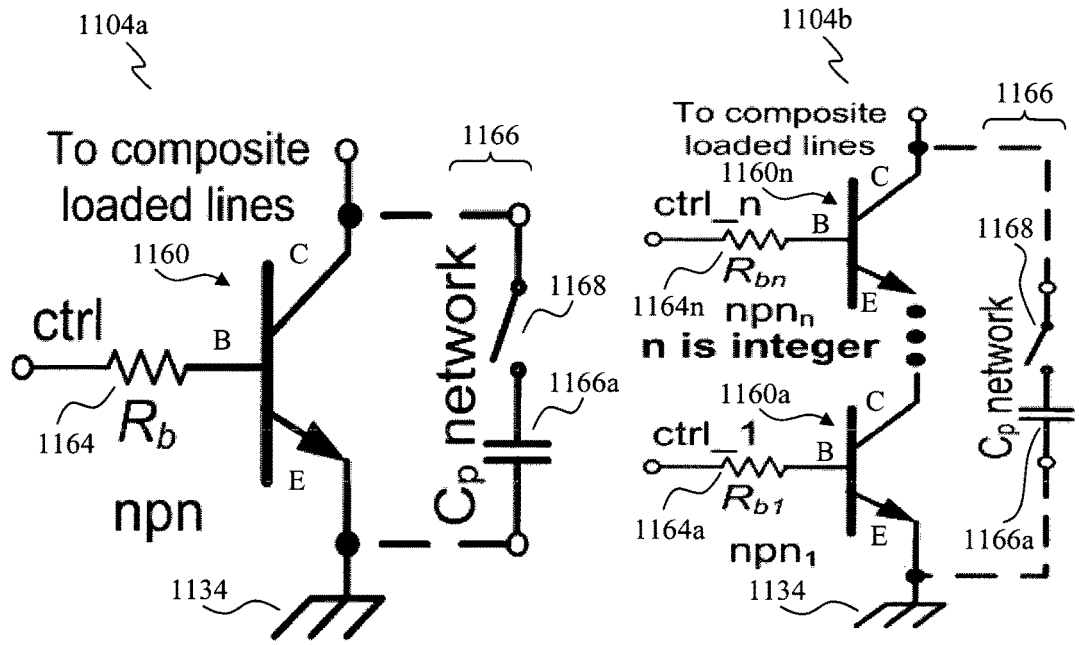
FIG. 11A
FIG. 11B
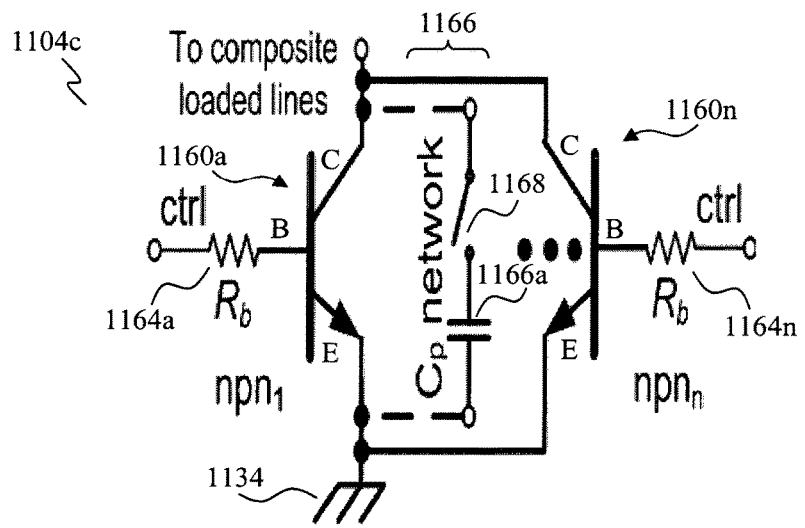
FIG. 11C

SWITCHING CIRCUIT

CROSS-REFERENCE TO RELATED APPLICATIONS

This application claims the benefit of priority of US provisional application No. 61/821,741, filed 10 May 2013, and U.S. provisional application No. 61/822,946, filed 14 May 2013, contents of them being hereby incorporated by reference in their entirety for all purposes.

TECHNICAL FIELD

Various embodiments relate to a switching circuit and a transceiver including the switching circuit.

BACKGROUND

The transmit/receive (T/R) switch is, a crucial functional block in a radio frequency (RF) transceiver front-end, which generally includes one transmission branch and one reception branch. Along the reception branch, the received RF signals will be passed through a bandpass filter (BPF) and then switched by a T/R switch to a low-noise amplifier (LNA); while in the transmission branch, the transmitted RF signals will be amplified by a power amplifier (PA), and then switched by the T/R switch to the antenna. In particular, a T/R switch can be found in any time-division duplexing (TDD)-based radio front-end, and it connects radio transmitter (TX) and receiver (RX) alternatively to a shared antenna (ANT). A TDD radio system can inherently offer a number of advantages and flexibilities that a frequency-division duplexing (FDD) radio system cannot. These advantages include channel reciprocity, dynamic bandwidth allocation, and higher frequency diversity. TDD is dominant in 3G, 4G LTE/WiMAX, Bluetooth, WLAN, UWB and 60 GHz radio systems and is expanding its share in cellular radio systems.

Many switches have been implemented to address the particular performance parameters. To achieve low insertion loss, most of the switches are implemented by monolithic microwave integrated circuits with traveling wave techniques and discrete active components such as PIN diodes and gallium arsenide (GaAs) pseudomorphic high-electron-mobility transistors (PHEMTs), especially at high frequencies. For example, transmission lines, stubs and PIN diodes may be adopted to realize discrete TDD T/R switch. Prior art switches may use PIN diodes to implement low insertion loss switches. However, these types of switches are too bulky to be integrated on-chip with the entire transceiver. In addition, the cost of the process used is high.

T/R switches using a series-shunt topology with CMOS (complementary metal-oxide-semiconductor) process have also been proposed, owing to the low cost and high integration ability of the CMOS process. Floating bulk is also used in MOSFET transistors of the switches to reduce the effects of parasitic diodes, leading to enhanced linearity and power handling ability. However, due to the limitation of the CMOS process and circuit topology, their operating bandwidth is limited to low-giga-hertz applications. For high frequency applications, the traveling wave concept is used commonly to extend the operating frequency. Nevertheless, for an operating frequency above 50 GHz, switches are mostly dominated by GaAs switches.

SUMMARY

According to an embodiment, a switching circuit is provided. The switching circuit may include a transmission line arrangement including a plurality of transmission lines coupled to each other by at least one of an electric coupling or a magnetic coupling, and at least one switching element arrangement coupled to at least one transmission line of the plurality of transmission lines, wherein, in a first mode of operation, the at least one switching element arrangement is configured in a first state, wherein, in a second mode of operation, the at least one switching element arrangement is configured in a second state, and wherein the transmission line arrangement is configured to, depending on whether the at least one switching element arrangement is configured in the first state or whether the at least one switching element arrangement is configured in the second state, generate a standing wave from an input signal received by the transmission line arrangement, the standing wave being coupled between at least some of the plurality of transmission lines through the at least one transmission line into an output signal, wherein the output signal is transmitted from the transmission line arrangement.

According to an embodiment, a transceiver is provided. The transceiver may include a switching circuit as described herein.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIGS. 11A to 11C show schematic diagrams of transistor/diode networks with npn transistor, according to various embodiments.

DETAILED DESCRIPTION

Figure 1:
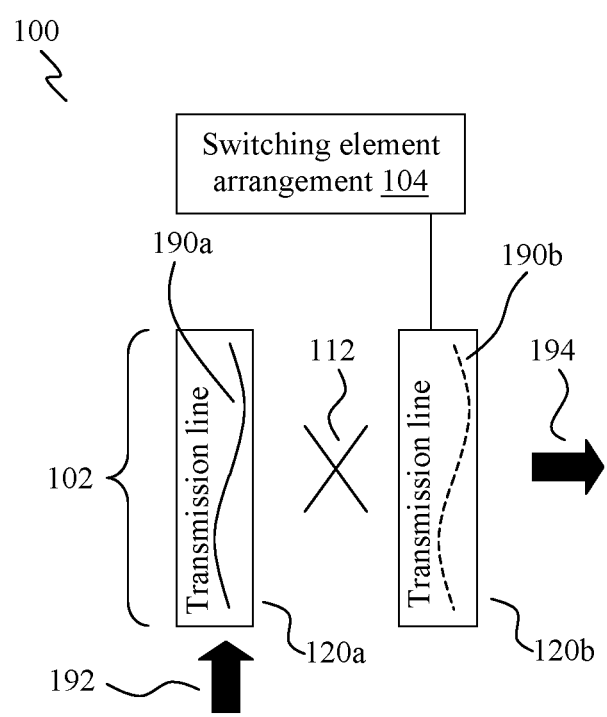
FIG. 1 shows a schematic cross-sectional view of a switching circuit, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may provide a switch, for example a standing-wave switch. The standing-wave switch may be implemented for Radio Frequency Integrated Circuit (RFIC).

Various embodiments may provide a technique named standing-wave switch (SWS) for a switch design and its implementation for RFIC. The technology of various embodiments for the standing-wave switch is based on the standing-wave transmission or propagation rather than a conventional traveling wave switch, and may have advantages over the conventional way, for example, in terms of low insertion loss and compact size.

Generally, for conventional switches such as the traveling wave types of switches or other types, the switch insertion loss highly relies or depends on the loss of the transistor or diode loss of the switches. Normally, at high frequency up to ten-of-giga-hertz, the equivalent on-resistance of the transistor for the "on" status of the switch is high, thus the insertion loss is high. Different from the conventional method, various embodiments provides a standing-wave switch (SWS) implementation method, which may have less or even no dependence on the transistors' equivalent on-resistance in the switch. Thus, it may be possible to achieve very low insertion loss for high frequency applications. The method may be used with various processes and the corresponding switch may have a compact size.

Various embodiments may provide a standing-wave switch concept, which may be different from conventional traveling-wave switches and other types of switches. The switches of various embodiments may be based on the standing-wave mode of resonators under the control of active elements. The principle or concept of various embodiments may be applicable to quarter-wavelength, half-wavelength or above mode standing-wave switches. In various embodiments, during the switch operation, the composite loaded lines of the switches and their diode/transistor may operate under the resonant condition to enable the switches to work under either the "on" status or the "off" status according to one or more control signals. Various embodiments may provide advantages over the conventional method, for example in terms of low insertion loss and compact size.

FIG. 1 shows a schematic cross-sectional view of a switching circuit 100, according to various embodiments. The switching circuit 100 includes a transmission line arrangement 102 including a plurality of transmission lines 120a, 120b coupled to each other by at least one of an electric coupling or a magnetic coupling (the coupling being indicated as "X" 112), and at least one switching element arrangement 104 coupled to at least one transmission line (e.g. 120b) of the plurality of transmission lines 120a, 120b, wherein, in a first mode of operation, the at least one switching element arrangement 104 is configured in a first state, wherein, in a second mode of operation, the at least one switching element arrangement 104 is configured in a second state, and wherein the transmission line arrangement 102 is configured to, depending on whether the at least one switching element arrangement 104 is configured in the first state or whether the at least one switching element arrangement 104 is configured in the second state, generate a standing wave 190a from an input signal 192 received by the transmission line arrangement 102, the standing wave 190a being coupled between at least some of the plurality of transmission lines 120a, 120b through the at least one transmission line into an output signal 194, wherein the output signal 194 is transmitted from the transmission line arrangement 102.

In other words, the switching circuit (or switch) 100 may include a transmission line arrangement (e.g. one (set of) or a plurality of (sets of) composite loaded lines) 102. The transmission line arrangement 102 may include at least two transmission lines 120a, 120b coupled to each other by an electric coupling and/or a magnetic coupling. The plurality of transmission lines 120a, 120b may be arranged at least substantially parallel to each other. It should be appreciated that the transmission line arrangement 102 may include two, three, four or any higher number of transmission lines, which may be coupled to each other by an electric coupling and/or a magnetic coupling. The switching circuit 100 may further include at least one switching element arrangement (e.g. a transistor/diode (T/D) network) 104 coupled to at least one transmission line of the transmission line arrangement 102.

In a first mode of operation of the switching circuit 100, the at least one switching element arrangement 104 may be configured in a first state, while in a second mode of operation of the switching circuit 100, the at least one switching element arrangement 104 may be configured in a second state. Further, depending on the state (i.e. whether in the first state or in the second state) of the at least one switching element arrangement 104, the transmission line arrangement 102 may generate a standing wave 190a from an input signal (e.g. an RF signal) received by the transmission line arrangement 102, where the standing wave 190a may be coupled from the transmission line 120a to the transmission line 120b as the standing wave 190b, into an output signal 194, where the output signal 194 may be transmitted from the transmission line arrangement 102.

In the context of various embodiments, the first state of the at least one switching element arrangement 104 may refer to an "off" status, while the second state of the at least one switching element arrangement 104 may refer to an "on" status.

In various embodiments, in the second mode of operation, the at least one transmission line may be at least substantially non-transmissive to at least one of the input signal 192 or the output signal 194. In other words, when the at least one switching element arrangement 104 is configured in the second state (e.g. an "on" status), in response to the second state of the at least one switching element arrangement 104, the transmission line arrangement 102 may be configured to at least substantially prevent (or block) transmission of at least one of the input signal 192 or the output signal 194 through (and out of) the at least one transmission line. This may mean that, in various embodiments, in the second mode of operation, the transmission line arrangement 102 may be configured in a non-activated or passive state (e.g. an "off" status).

Accordingly, it may mean that in the first mode of operation of the switching circuit 100, the at least one switching element arrangement 104 may be configured in the first state (e.g. an "off" status), and in response to the first state of the at least one switching element arrangement 104, the transmission line arrangement 102 may be configured to generate the standing wave 190a from the input signal (e.g. an RF signal) received by the transmission line arrangement 102, where the standing wave 190a may be coupled from the transmission line 120a to the transmission line 120b as the standing wave 190b, into an output signal 194, wherein the output signal 194 may be transmitted from the transmission line arrangement 102. In other words, in various embodiments, in the first mode of operation, the transmission line arrangement 102 may be configured in an active or activated state (e.g. an "on" status).

In various embodiments, the input signal 192 may be provided to or fed through the transmission line arrangement 102.

The standing wave 190a may be coupled between at least some of the plurality of transmission lines 120a, 120b by means of the electric coupling and/or magnetic coupling between transmission lines of the plurality of transmission lines 120a, 120b.

In the context of various embodiments, the plurality of transmission lines 120a, 120b may be coupled to each other by means of at least one of a capacitor, which may effect an electric coupling, or an inductor, which may effect a magnetic coupling.

In various embodiments, the effect of employing a plurality of transmission lines 120a, 120b coupled to each other may be to make the length of the transmission lines 120a, 120b much shorter than quarter-wavelength and the quality factor may be significantly improved. Furthermore, this may lead to a compact size and low loss.

In various embodiments, an end side of each transmission line 120a, 120b opposite to the short end side (e.g. grounded) may be an open end side (e.g. where a node may be positioned). The open end side may be connected to the at least one switching element arrangement 104.

In various embodiments, the at least one switching element arrangement 104 may be coupled to an open end side (e.g. where a node may be positioned) of the at least one transmission line.

In various embodiments, in the first mode of operation, when an input signal 192 or energy is injected into the transmission line arrangement 102, the energy may propagate forward waves along at least one transmission line 120a toward a short end side (e.g. ground) of the at least one transmission line 120a, where the energy may be reflected into reverse waves. In steady state, the forward waves and the reverse waves may superpose to form a standing wave 190a. This may mean that the incident (forward) waves may be at least substantially completely reflected with an inverted phase, thereby forming the standing wave 190a, which may have a maximum absolute voltage amplitude at the open-end side of the transmission line 120a and a minimum voltage swing at the short end side of the transmission line 120a.

Each transmission line 120a, 120b may include an end side connected to ground, and a node (which may be an open side or open end side). This may mean that each transmission line 120a, 120b may have a short end side that may be connected to ground and an open end side. The open end side may be connected to the at least one switching element arrangement 104 or may be connected to a capacitor or may be left as open.

In various embodiments, each transmission line 120a, 120b may be or may include a quarter-wavelength ($\lambda/4$) transmission line or a half-wavelength ($\lambda/2$) transmission line.

In various embodiments, the at least one switching element arrangement 104 may be coupled between the at least one transmission line (e.g. 120b) and ground.

In the context of various embodiments, each transmission line 120a, 120b may include an end side connected to ground, and a node, wherein the at least one switching element arrangement 104 may be coupled to at least one of the nodes, and wherein adjacent transmission lines of the plurality of transmission lines 120a, 120b may be arranged with their respective end sides arranged on a same side of the transmission line arrangement 102. In various embodiments, each transmission line 120a, 120b may include an inductive element (e.g. an inductor or a spiral inductor), and the adjacent transmission lines may define a transformer (including e.g. a multiple-port transformer).

In the context of various embodiments, each transmission line 120a, 120b may include an end side connected to ground, and a node, wherein the at least one switching element arrangement 104 may be coupled to at least one of the nodes, and wherein adjacent transmission lines of the plurality of transmission lines 120a, 120b may be arranged with their respective end sides arranged on opposite sides of the transmission line arrangement 102.

In various embodiments, the at least one switching element arrangement 104 may be coupled to at least one node, meaning that the at least one switching element arrangement 104 may be coupled to at least one transmission line.

In the context of various embodiments, the node of each transmission line 120a, 120b may be at an end region of the transmission line 120a, 120b opposite to the end side of the transmission line 120a, 120b connected to ground. Alternatively, the node of each transmission line 120a, 120b may be at other parts of the transmission line 120a, 120b, and not necessarily at an end region of the transmission line 120a, 120b. In other words, the switching element arrangement 104 may be coupled to other parts of the transmission line 120a, 120b.

In various embodiments, the switching circuit 100 may include a plurality of switching element arrangements wherein a first switching element arrangement of the plurality of switching element arrangements may be coupled to one transmission line (e.g. 120a) of the plurality of transmission lines 120a, 120b, and wherein a second switching element arrangement of the plurality of switching element arrangements may be coupled to another transmission line (e.g. 120b) of the plurality of transmission lines 120a, 120b. Each switching element arrangement may be as described in the context of the switching element arrangement 104.

In the context of various embodiments, each transmission line of the plurality of transmission lines 120a, 120b may include a resonator (or a resonant element). Therefore, the switching circuit 100 may include a plurality of resonators. Employing a plurality of resonators coupled to each other by an electric coupling and/or a magnetic coupling may provide improved insertion loss and/or achieve compact size.

In various embodiments, each resonator may include a quarter-wavelength ($\lambda/4$) resonator or a half-wavelength ($\lambda/2$) resonator. However, it should be appreciated that other types of resonators may be employed, e.g. above mode standing-wave resonators.

Accordingly, in various embodiments, the transmission line arrangement. 102 may be a quarter-wavelength ($\lambda/4$) transmission line arrangement (e.g. the transmission line may be a quarter-wavelength ($\lambda/4$) transmission line or may include a quarter-wavelength ($\lambda/4$) resonator), or may be a half-wavelength ($\lambda/2$) transmission line arrangement (e.g. the transmission line may be a half-wavelength ($\lambda/2$) transmission line or may include a half-wavelength ($\lambda/2$) resonator).

In various embodiments, each resonator may include an LC resonant circuit (or LC tank). The LC resonant circuit may include an inductor (L) and a capacitor (C) connected in parallel to each other.

In the context of various embodiments, each transmission line of the plurality of transmission lines 120a, 120b may include an inductive element (e.g. an inductor or a spiral inductor).

In the context of various embodiments, each transmission line of the plurality of transmission lines 120a, 120b may include a microwave transmission line. This may mean that each transmission line 120a, 120b may be or may include a microwave transmission line, e.g. a distributed microwave transmission line such as a microstrip, a coplanar waveguide, a stripline, a coplanar stripline (CPS), etc.

In various embodiments, the at least one switching element arrangement 104 (or each switching element arrangement) may include at least one switching element including at least one of a capacitor, a varactor, a diode, a resistor, a switch (e.g. a MEMS switch) or a transistor. In various embodiments, the switching circuit 100 may further include a capacitive element arrangement connected in parallel with the at least one switching element.

In the context of various embodiments, the capacitive element arrangement may include one (single) capacitor or a plurality of capacitors (e.g. a capacitor network). The capacitive element arrangement may further include a switch connected in series with the single capacitor or the capacitor network. The capacitor (or each capacitor) of the capacitive element arrangement may be of various types of capacitors, including varactors. The switch of the capacitive element arrangement may include a switching element arrangement as described herein. In various embodiments, the capacitive element arrangement may be optional.

In various embodiments, the at least one switching element arrangement 104 (or each switching element arrangement) may include at least one transistor. The at least one transistor (or each transistor) may be or may include a field effect transistor (FET) (e.g. NFET or PFET) or a bipolar junction transistor (BJT) (e.g. npn BJT or pnp BJT). A resistor may be provided, connected in series or in parallel to the at least one (or each) transistor.

In various embodiments, the at least one switching element arrangement 104 (or each switching element arrangement) may include at least one transistor connected between the transmission line arrangement 102 and ground, wherein the at least one transistor may be configured to receive at least one control signal to control the operation of the transistor.

In various embodiments, the at least one switching element arrangement 104 (or each switching element arrangement) may include at least one transistor connected between the transmission line arrangement 102 and a power supply, wherein the at least one transistor may be configured to receive at least one control signal to control the operation of the transistor.

In various embodiments, a capacitive element arrangement as described herein may be connected in parallel with the at least one transistor.

In various embodiments, the at least one switching element arrangement 104 (or each switching element arrangement) may include a transistor having a first terminal (e.g. a source (S) terminal or an emitter (E) terminal) connected to ground, or configured to receive a power supply voltage (e.g. connected to a power supply), a second terminal (e.g. a drain (D) terminal or a collector (C) terminal) connected to the at least one transmission line, and a third terminal (e.g. a gate (G) terminal or a base (B) terminal) configured to receive a control signal, wherein the at least one switching element arrangement 104 may be configured to be in the first state or the second state in response to the control signal. The third terminal may be connected in series with a resistor (e.g. a gate resistor or a base resistor). A capacitive element arrangement as described herein may be connected in parallel with the transistor (e.g. connected between the first and second terminals of the transistor).

In various embodiments, the at least one switching element arrangement 104 (or each switching element arrangement) may include at least two (or a plurality of) transistors connected in series, each transistor having a first terminal (e.g. a source (S) terminal or an emitter (E) terminal), a second terminal (e.g. a drain (D) terminal or a collector (C) terminal), and a third terminal (e.g. a gate (G) terminal or a base (B) terminal), wherein the first terminal of a first transistor of the at least two transistors may be connected to ground, wherein the second terminal of a last transistor of the at least two transistors may be connected to the at least one transmission line, wherein the respective third terminals may be configured to receive a respective control signal, and wherein the at least one switching element arrangement 104 may be configured to be in the first state or the second state in response to the respective control signals. Each third terminal may be connected in series with a resistor (e.g. a gate resistor or a base resistor). The respective control signals may be the same or may be different. The at least two transistors may be identical or different A capacitive element arrangement as described herein may be connected in parallel with the at least two transistors (e.g. connected between the first terminal of the first transistor and the second terminal of the last transistor). In other words, a transistor network having the at least two series transistors may be connected in parallel with the capacitive element arrangement.

In various embodiments, the at least one switching element arrangement 104 (or each switching element arrangement) may include at least two (or a plurality of) transistors connected in series, each transistor having a first terminal (e.g. a source (S) terminal or an emitter (E) terminal), a second terminal (e.g. a drain (D) terminal or a collector (C) terminal), and a third terminal (e.g. a gate (G) terminal or a base (B) terminal), wherein the second terminal of a first transistor of the at least two transistors may be connected to the at least one transmission line, wherein the first terminal of a last transistor of the at least two transistors may be configured to receive a power supply voltage (e.g. connected to a power supply), wherein the respective third terminals may be configured to receive a respective control signal, and wherein the at least one switching element arrangement 104 may be configured to be in the first state or the second state in response to the respective control signals. Each third terminal may be connected in series with a resistor (e.g. a gate resistor or a base resistor). The respective control signals may be the same or may be different. The at least two transistors may be identical or different. A capacitive element arrangement as described herein may be connected in parallel with the at least two transistors (e.g. connected between the second terminal of the first transistor and the first terminal of the last transistor). In other words, a transistor network having the at least two series transistors may be connected in parallel with the capacitive element arrangement.

In various embodiments, the at least one switching element arrangement 104 (or each switching element arrangement) may include at least two (or a plurality of) transistors connected in parallel, each transistor having a first terminal (e.g. a source (S) terminal or an emitter (E) terminal), a second terminal (e.g. a drain (D) terminal or a collector (C) terminal), and a third terminal (e.g. a gate (G) terminal or a base (B) terminal), wherein the first terminals of the at least two transistors may be connected to ground, or configured to receive a power supply voltage (e.g. connected to a power supply), wherein the second terminals of the at least two transistors may be connected to the at least one transmission line, wherein the respective third terminals may be configured to receive a respective control signal, and wherein the at least one switching element arrangement 104 may be configured to be in the first state or the second state in response to the respective control signals. Each third terminal may be connected in series with a resistor (e.g. a gate resistor or a base resistor). The respective control signals may be the same or may be different. The at least two transistors may be identical or different. A capacitive element arrangement as described herein may be connected in parallel with the at least two transistors (e.g. connected between the first terminals of the at least two transistors and the second terminals of the at least two transistors). In other words, a transistor network having the at least two parallel transistors may be connected in parallel with the capacitive element arrangement.

In the context of various embodiments, where the first terminal of the transistor is connected to ground, the transistor may be an NFET (n-channel field effect transistor) or an npn transistor, and where the first terminal of the transistor is connected to a power supply, the transistor may be a PFET (p-channel field effect transistor) or a pnp transistor.

In various embodiments, the switching circuit 100 may further include at least two input/output (I/O) ports coupled to the transmission line arrangement 102, wherein the input signal 192 may be received via one input/output port of the at least two input/output ports, acting as an input port, and wherein the output signal 194 may be transmitted via another input/output port of the at least two input/output ports, acting as an output port. In other words, the input signal (e.g. RF signal) 192 may be received by the switching circuit 100 via one of the input/output ports, and an output signal 194 may be transmitted from the switching circuit 100 via at least one other port of the input/output ports. In various embodiments, the at least two input/output ports may be coupled to the transmission line arrangement 102 at any parts of the transmission line arrangement (e.g. at any positions along a length direction of the transmission line arrangement), depending on the bandwidth requirements.

In various embodiments, each input/output port may be coupled to the transmission line arrangement 102 via at least one of an inductive element (e.g. an inductor) or a capacitive element (e.g. a capacitor).

In various embodiments, a respective input/output port may be coupled to a respective transmission line of the transmission line arrangement 102. The respective input/output port may be coupled to the respective transmission line at any parts of the respective transmission line (e.g. at any positions along a length direction of the respective transmission line), depending on the bandwidth requirements.

In various embodiments, where two input/output ports may be provided, one port may act as an input port while the other port may act as an output port. In this way, the switching circuit 100 may be configured as a Single-Pole-Single-Throw (SPST) switching circuit.

In various embodiments, where three input/output ports may be provided, one port may act as an input port while the other ports may act as output ports. In this way, the switching circuit 100 may be configured as a Single-Pole-Double-Throw (SPST) switching circuit.

It should be appreciated that any number of input/output ports more than two may be provided such that the switching circuit 100 may be configured as a Single-Pole-Multiple-Throw switching circuit.

In various embodiments, the at least one switching element arrangement 104 (or each switching element arrangement) may include an inductor connected in series with a capacitor, wherein the inductor and the capacitor may be connected between the at least one transmission line and ground. At least one of the inductor or the capacitor may be variable. The inductor may be at least one of a spiral inductor, a transmission line or a transformer.

In various embodiments, the at least one switching element arrangement 104 (or each switching element arrangement) may include a diode arrangement connected between the at least one transmission line and ground, wherein the at least one switching element arrangement 104 may be configured to be in the first state or the second state in response to a biasing voltage applied to the diode arrangement. In various embodiments, a transmission line may be connected between the diode arrangement and the at least one transmission line. In various embodiments, a resistor may be connected in series or in parallel with the diode arrangement. In various embodiments, a capacitive element arrangement as described herein may be connected in parallel with the diode arrangement. In various embodiments, the diode arrangement may include one (single) diode or a plurality of diodes (e.g. a diode network). In various embodiments, the diode arrangement may include one or more PIN diodes.

In various embodiments, the switching circuit 100 may further include a control circuit adapted to provide at least one control signal to configure the at least one switching element arrangement 104 to be in the first state or the second state. The at least one control signal may configure the at least one switching element arrangement 102 to be in the first state (e.g. "off" status), which in turn may control the end side (e.g. open end side) of one or more transmission lines to be in an open status, which may thereby configure the transmission line arrangement to be in an active or activated state (e.g. an "on" status). Further, the at least one control signal may configure the at least one switching element arrangement 102 to be in the second state (e.g. "on" status), which in turn may control the end side (e.g. open end side) of one or more transmission lines to be in a short status, which may thereby configure the transmission line arrangement 102 to be in a non-activated or passive state (e.g. an "off" status).

Accordingly, in various embodiments, the at least one switching element arrangement 104 and the transmission line arrangement 102 may be in opposite states or status during operations. In other words, when the at least one switching element arrangement 104 is configured to be in the second state (e.g. "on" status), the transmission line arrangement 102 is configured to be in a non-activated or passive state (e.g. an "off" status), and vice versa.

In the context of various embodiments, each transmission line or resonator may be in a standing wave status, where the plurality of transmission lines or resonators may be coupled to each other. The overall effect of the multiple transmission lines or resonators may enable the length of each transmission line or resonator to be made much shorter than quarter-wavelength and the quality factor to be significantly improved. In various embodiments, each transmission line or resonator may generate a separate standing wave.

In the context of various embodiments, the term "composite loaded lines" may mean or may include transmission lines, where there may be coupling between or among the transmission lines, which may be electric coupling, magnetic coupling or both. The transmission lines may be implemented by resonators or may also be implemented by using lumped elements such as one or more inductors, one or more capacitors or their combination. The resonator may be of any loaded format such as periodic transmission loading, capacitor loading or other type, and thus the resonator may not be required to be at least substantially exactly quarter-wavelength but may be shorter than quarter-wavelength. Nevertheless, the resonator may be configured to generate a standing wave.

In the context of various embodiments, it should be appreciated that any capacitor employed in the switching circuit 100 may be any type of capacitors, including tunable varactors.

In the context of various embodiments, the transmission line arrangement 102 may be a standing-wave transmission line arrangement.

In the context of various embodiments, the switching circuit 100 may be a standing-wave switch, based on the standing-wave mode of the transmission lines or resonators of the switching circuit 100.

In the context of various embodiments, the switching circuit 100 may be applicable to quarter-wavelength ($\lambda/4$), half-wavelength ($\lambda/2$) or above mode standing-wave switches, or LC tank and transformer type switches.

The switch of various embodiments may be a reciprocal network, meaning that an input signal provided via one port may be transmitted to another port if the selected path is turned "on". An output signal may be provided from the input signal but may be with additional loss due to the switch losses.

Various embodiments may also provide a transceiver including a switching circuit as described herein.

Various embodiments may provide a standing-wave switch (SWS). The standing-wave switch may include one (set of) or more (sets of) composite loaded lines (or transmission line arrangement) and one or more transistor/diode (T/D) networks coupled to the composite loaded lines. The composite loaded lines may include one or more resonators which may be adapted or configured to generate a standing wave. The transistor/diode (T/D) networks may be operable in response to one or more control signals.

The principle or concept of various embodiments may be applicable to quarter-wavelength ($\lambda/4$) resonators, half-wavelength ($\lambda/2$) resonators or above mode standing-wave resonators or LC (inductor-capacitor) tanks and transformer type switches. Examples of some types of quarter-wavelength standing-wave switches will be described herein to illustrate the concept of various embodiments due to their compact size. However, it should be appreciated that the descriptions herein may be applicable to other types of standing-wave switches (SWS).

For a quarter-wavelength standing-wave switch (SWS), when energy is injected into the composite loaded lines of the switch, the energy may propagate forward waves along the quarter-wave transmission lines toward a short, where the energy may be reflected into reverse waves. In steady state, the forward waves and the reverse waves may superpose to form a standing-wave. The boundary conditions allow standing-wave modes at $l=n*\lambda/4$ (where n= 1, 3, 5, . . . ), where l is the transmission line length. The standing-wave switches of various embodiments may adopt or employ the fundamental mode ($l=\lambda/4$) since higher modes may be of relative insignificance due to a substantial high frequency loss associated with the higher modes.

In the switch, the composite loaded lines with one resonant element, e.g. a $l=\lambda/4$ resonator or its' modified structures, may perform a switching function of "on" or "off" through the control of the corresponding "off" or "on" status of the diode/transistor networks of the switch. The use of composite loaded lines with more than one resonant element may enable the switch to perform a further type of loading and controlling to provide a better insertion loss and also to achieve a compact size. One or more high quality factor capacitors may be connected to the open-end of the composite loaded lines according to the connections of the diode/transistor networks.

Various embodiments will now be described by way of the following non-limiting examples, with reference to the accompanying drawings. However, it should be appreciated that other designs, architectures and modifications may be possible.

Figure 2A:
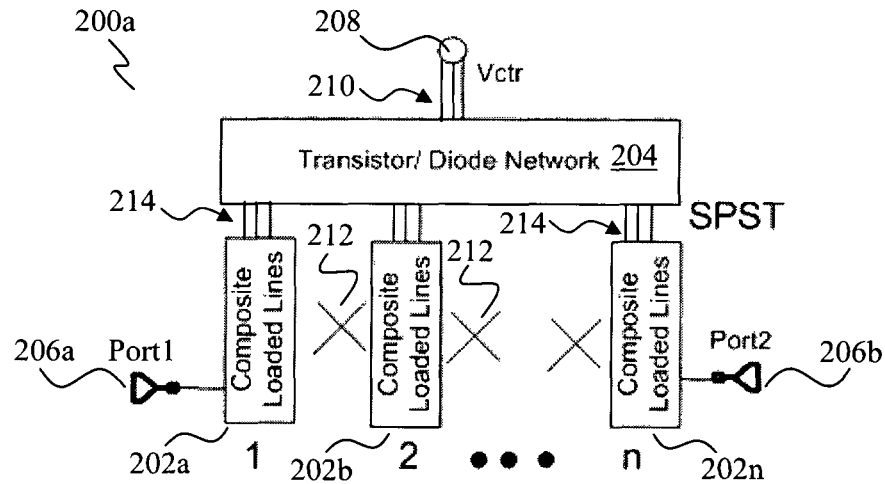
FIG. 2A shows a schematic diagram of a standing-wave switch, according to various embodiments.

FIG. 2A shows a schematic diagram of a standing-wave switch 200a, according to various embodiments, illustrating an architecture of a Single-Pole-Single-Throw (SPST) standing-wave switch. The switch 200a may include one or multiple composite loaded lines 202a, 202b, 202n, a transistor/diode (T/D) network 204, RF (radio frequency) I/O ports 206a, 206b and digital control interfaces 208, 210.

The standing-wave switch 200a may be an SPST standing-wave switch, meaning that the switch 200a may include an input port and an output port. For example, the standing-wave switch 200a may include a first port 206a (e.g. Port1) which may be an input port (or an output port) and a second port 206b (e.g. Port2) which may be an output port (or an input port). The input signal received by the first port 206a or the second port 206b may be an input RF signal.

The standing-wave switch 200a may include a plurality of composite loaded lines (as part of a transmission line arrangement). The number of composite loaded lines may be 2n+1 where n is an integer. For example, the switch 200a may include a first (set of) composite loaded lines 202a, a second (set of) composite loaded lines 202b, up to an nth (set of), where "n" may be 3, 4 or any higher number, composite loaded lines 202n. The coupling, as represented by "X" 212, between or among the multiple composite loaded lines 202a, 202b, 202n, may be electrical coupling, magnetic coupling or both, which may be implemented using lumped elements such as one or more inductors, one or more capacitors or any combination thereof.

Figure 2B:
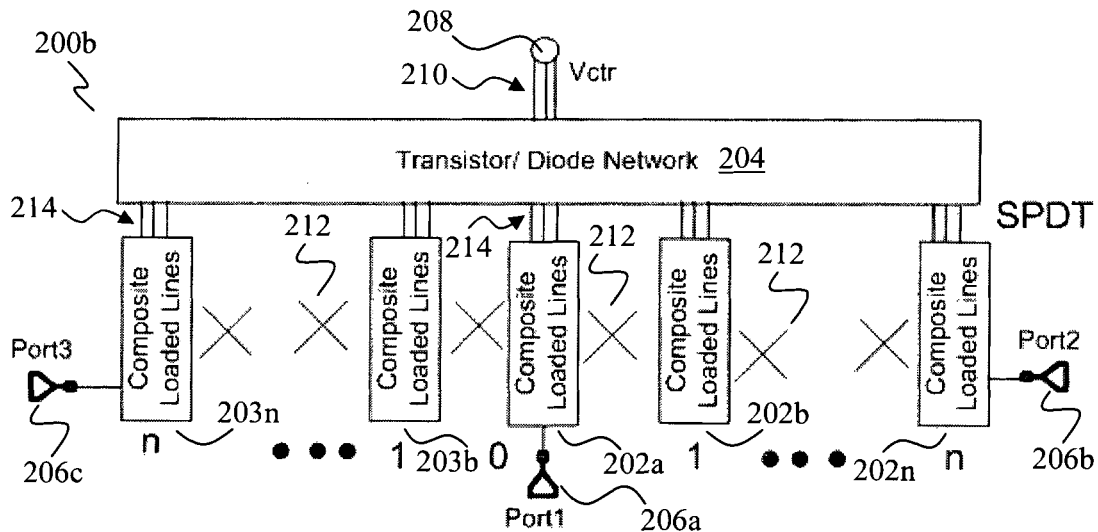
FIG. 2B shows a schematic diagram of a standing-wave switch, according to various embodiments.
Figure 2C:
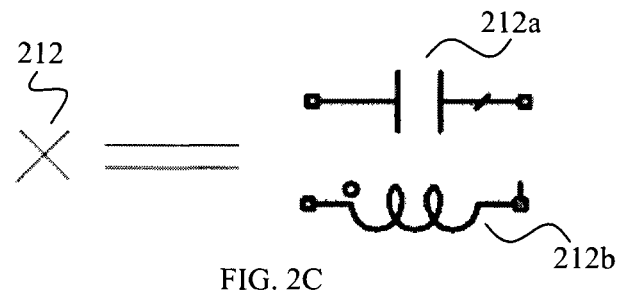
FIG. 2C shows examples of coupling between or among the composite loaded lines of the switch of various embodiments.

As shown in FIG. 2C, at least one capacitive element (e.g. a capacitor) 212a may be provided between adjacent sets of composite loaded lines to effect electrical coupling, while at least one inductive element (e.g. an inductor) 212b may be provided between adjacent sets of composite loaded lines to effect magnetic coupling. Further, at least one capacitive element 212a and at least one inductive element 212b may be connected in series or in parallel to each other between adjacent sets of composite loaded lines to effect electrical and magnetic coupling.

In various embodiments, each set of the composite loaded lines 202a, 202b, 202n of the switch 200a may include or may be, but not limited to, a single resonator or a plurality of resonators coupled to each other. In various embodiments, each resonator of the composite loaded lines 202a, 202b, 202n of the switch 200a may include or may be, but not limited to, a quarter-wavelength ($\lambda/4$) resonator or a half-wavelength ($\lambda/2$) resonator. In various embodiments, each set of the composite loaded lines 202a, 202b, 202n of the switch 200a may include one or more quarter-wavelength ($\lambda/4$) resonators and/or one or more half-wavelength ($\lambda/2$) resonators. The composite loaded lines 202a, 202b, 202n of the switch 200a may be as described further below, including in the context of various embodiments illustrated in the corresponding figures.

The first port 206a and the second port 206b may be coupled to the composite loaded lines 202a, 202b, 202n. For example, the first port 206a may be coupled to the first composite loaded lines 202a, while the second port 206b may be coupled to the nth composite loaded lines 202n. As a non-limiting example, an input RF signal may be fed through the first composite loaded lines 202a, via the first port 206a, to the second port 206b as the output port.

The switch 200a may further include a transistor/diode (T/D) network 204. The T/D network 204 may include one or more transistors and/or one or more diodes. The T/D network 204 of the switch 200a may be as described further below, including in the context of various embodiments illustrated in the corresponding figures. The transistor/diode (T/D) network 204 may be connected or coupled to the composite loaded lines 202a, 202b, 202n, for example by means of respective interconnections 214.

The switch 200a may further include a node 208 and an interconnection 210 connecting the T/D network 204 and the node 208. The node 208 may be connected to a control circuit (not shown) which may provide a control signal, Vctr, to the T/D network 204 to control the operation of the T/D network 204, for example to switch the T/D network 204 between an "on" status or an "off" status.

FIG. 2B shows a schematic diagram of a standing-wave switch 200b, according to various embodiments, illustrating an architecture of a Single-Pole-Double-Throw (SPDT) standing-wave switch. The switch 200b may include one or multiple composite loaded lines 202a, 202b, 203b, 202n, 203n, a transistor/diode (T/D) network 204, RF I/O ports 206a, 206b, 206c and digital control interfaces 208, 210.

The standing-wave switch 200b may be an SPDT standing-wave switch, meaning that the switch 200b may include an input port and two output ports. For example, the standing-wave switch 200b may include a first port 206a (e.g. Port1), a second port 206b (e.g. Port2) and a third port 206c (e.g. Port3), where one of these ports may be an input port configured to receive an input signal (e.g. an input RF signal).

The standing-wave switch 200b may include a plurality of composite loaded lines (as part of a transmission line arrangement). The number of composite loaded lines may be 2n+1 where n is an integer. For example, the switch 200b may include a first (set of) composite loaded lines 202a, and further (sets of) composite loaded lines which may be arranged on both sides of the composite loaded lines 202a. Referring to FIG. 2B, the switch 200b may include second (sets of) composite loaded lines 202b, 203b, up to nth (sets of), (where "n" may be 3, 4 or any higher number) composite loaded lines 202n, 203n. The coupling, as represented by "X" 212, between or among the multiple composite loaded lines 202a, 202b, 202n, 203b, 203n may be electrical coupling, magnetic coupling or both, as illustrated in FIG. 2C and as described in the context of the switch 200a of FIG. 2A.

In various embodiments, each set of the composite loaded lines 202a, 202b, 202n, 203b, 203n of the switch 200b may include or may be, but not limited to, a single resonator or a plurality of resonators coupled to each other. In various embodiments, each resonator of the composite loaded lines 202a, 202b, 202n, 203b, 203n of the switch 200b may include or may be, but not limited to, a quarter-wavelength ($\lambda/4$) resonator or a half-wavelength ($\lambda/2$) resonator. In various embodiments, each set of the composite loaded lines 202a, 202b, 202n, 203b, 203n of the switch 200b may include one or more quarter-wavelength ($\lambda/4$) resonators and/or one or more half-wavelength ($\lambda/2$) resonators. The composite loaded lines 202a, 202b, 202n, 203b, 203n of the switch 200b may be as described further below, including in the context of various embodiments illustrated in the corresponding figures.

The first port 206a, the second port 206b and the third port 206c may be coupled to the composite loaded lines 202a, 202b, 202n, 203b, 203n. For example, the first port 206a may be coupled to the first composite loaded lines 202a, the second port 206b may be coupled to the nth composite loaded lines 202n, while the third port 206c may be coupled to the nth composite loaded lines 203n. As a non-limiting example, an input RF signal may be fed through the first composite loaded lines 202a, via the first port 206a, as shown in FIG. 2B, to the second port 206b and/or the third port 206c as the output ports.

The switch 200b may further include a transistor/diode (T/D) network 204. The T/D network 204 may include one or more transistors and/or one or more diodes. The T/D network 204 of the switch 200b may be as described further below, including in the context of various embodiments illustrated in the corresponding figures. The transistor/diode (T/D) network 204 may be connected or coupled to the composite loaded lines 202a, 202b, 202n, 203b, 203n, for example by means of respective interconnections 214.

The switch 200b may further include a node 208 and an interconnection 210 connecting the T/D network 204 and the node 208. The node 208 may be connected to a control circuit (not shown) which may provide a control signal, Vctr, to the T/D network 204 to control the operation of the T/D network 204, for example to switch the T/D network 204 between an "on" status or an "off" status.

Figure 2D:
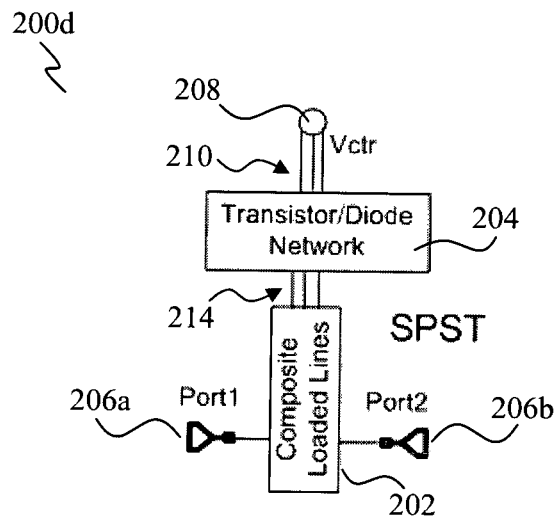
FIG. 2D shows a schematic diagram of a standing-wave switch, according to various embodiments.

FIG. 2D shows a schematic diagram of a standing-wave switch 200d, according to various embodiments, illustrating an architecture of a Single-Pole-Single-Throw (SPST) standing-wave switch. The switch 200d may include one (set of) composite loaded lines 202, a transistor/diode (T/D) network 204, RF (radio frequency) I/O ports 206a, 206b and digital control interfaces 208, 210.

The standing-wave switch 200d may be an SPST standing-wave switch, meaning that the switch 200d may include an input port and an output port. For example, the standing-wave switch 200d may include a first port 206a (e.g. Port1) which may be an input port (or an output port) and a second port 206b (e.g. Port2) which may be an output port (or an input port). The input signal received by the first port 206a or the second port 206b may be an input RF signal.

The standing-wave switch 200d may include one (set of) composite loaded lines (as part of a transmission line arrangement) 202. In various embodiments, the composite loaded lines 202 of the switch 200d may include or may be, but not limited to, a single resonator or a plurality of resonators coupled to each other. In various embodiments, each resonator of the composite loaded lines 202 of the switch 200d may include or may be, but not limited to, a quarter-wavelength ($\lambda/4$) resonator or a half-wavelength ($\lambda/2$) resonator. In various embodiments, the composite loaded lines 202 of the switch 200d may include one or more quarter-wavelength ($\lambda/4$) resonators and/or one or more half-wavelength ($\lambda/2$) resonators. The composite loaded lines 202 of the switch 200d may be as described further below, including in the context of various embodiments illustrated in the corresponding figures. The coupling between or among multiple composite loaded lines may be electrical coupling, magnetic coupling or both, as illustrated in FIG. 2C. The coupling between or among multiple composite loaded lines may be as described in the context of the switch 200a of FIG. 2A.

The first port 206a and the second port 206b may be coupled to the composite loaded lines 202. As a non-limiting example, an input RF signal may be fed through the first composite loaded lines 202, via the first port 206a, to the second port 206b as the output port.

The switch 200d may further include a transistor/diode (T/D) network 204. The T/D network 204 may include one or more transistors and/or one or more diodes. The T/D network 204 of the switch 200d may be as described further below, including in the context of various embodiments illustrated in the corresponding figures. The transistor/diode (T/D) network 204 may be connected or coupled to the composite loaded lines 202, for example by means of respective interconnections 214.

The switch 200d may further include a node 208 and an interconnection 210 connecting the T/D network 204 and the node 208. The node 208 may be connected to a control circuit (not shown) which may provide a control signal, Vctr, to the T/D network 204 to control the operation of the T/D network 204, for example to switch the T/D network 204 between an "on" status or an "off" status.

Figure 2E:
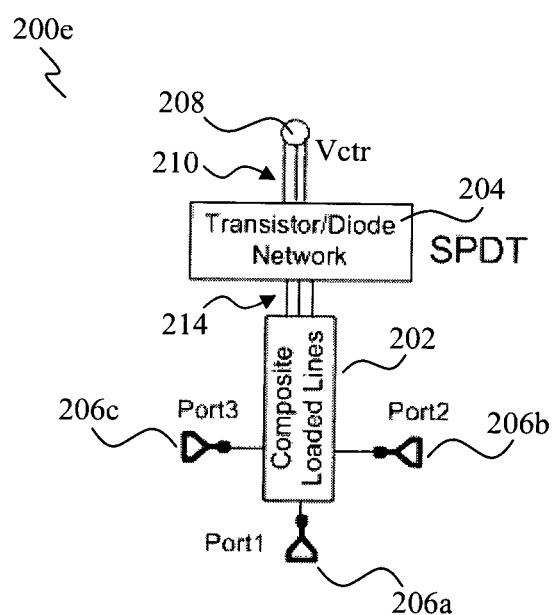
FIG. 2E shows a schematic diagram of a standing-wave switch, according to various embodiments.

FIG. 2E shows a schematic diagram of a standing-wave switch 200; according to various embodiments, illustrating an architecture of a Single-Pole-Double-Throw (SPDT) standing-wave switch. The switch 200e may include one (set of) composite loaded lines 202, a transistor/diode (T/D) network 204, RF (radio frequency) I/O ports 206a, 206b, 206c and digital control interfaces 208, 210.

The standing-wave switch 200e may be an SPDT standing-wave switch, meaning that the switch 200e may include an input port and two output ports. For example, the standing-wave switch 200e may include a first port 206a (e.g. Port1), a second port 206b (e.g. Port2) and a third port 206c (e.g. Port3), where one of these ports may be an input port configured to receive an input signal (e.g. an input RF signal).

The standing-wave switch 200e may include one (set of) composite loaded lines (as part of a transmission line arrangement) 202. In various embodiments, the composite loaded lines 202 of the switch 200e may include or may be, but not limited to, a single resonator or a plurality of resonators coupled to each other. In various embodiments, each resonator of the composite loaded lines 202 of the switch 200e may include or may be, but not limited to, a quarter-wavelength ($\lambda/4$) resonator or a half-wavelength ($\lambda/2$) resonator. In various embodiments, the composite loaded lines 202 of the switch 200e may include one or more quarter-wavelength ($\lambda/4$) resonators and/or one or more half-wavelength ($\lambda/2$) resonators. The composite loaded lines 202 of the switch 200e may be as described further below, including in the context of various embodiments illustrated in the corresponding figures. The coupling between or among multiple composite loaded lines may be electrical coupling, magnetic coupling or both, as illustrated in FIG. 2C. The coupling between or among multiple composite loaded lines may be as described in the context of the switch 200a of FIG. 2A.

The first port 206a, the second port 206b and the third port 206c may be coupled to the composite loaded lines 202. As a non-limiting example, an input RF signal may be fed through the first composite loaded lines 202, via the first port 206a, to the second port 206b as the output port. Additionally or alternatively, the input RF signal may be fed through the first composite loaded lines 202 to the third port 206c as the output port.

The switch 200e may further include a transistor/diode (T/D) network 204. The T/D network 204 may include one or more transistors and/or one or more diodes. The T/D network 204 of the switch 200e may be as described further below, including in the context of various embodiments illustrated in the corresponding figures. The transistor/diode (T/D) network 204 may be connected or coupled to the composite loaded lines 202, for example by means of respective interconnections 214.

The switch 200e may further include a node 208 and an interconnection 210 connecting the T/D network 204 and the node 208. The node 208 may be connected to a control circuit (not shown) which may provide a control signal, Vctr, to the T/D network 204 to control the operation of the T/D network 204, for example to switch the T/D network 204 between an "on" status or an "off" status.

Figure 3:
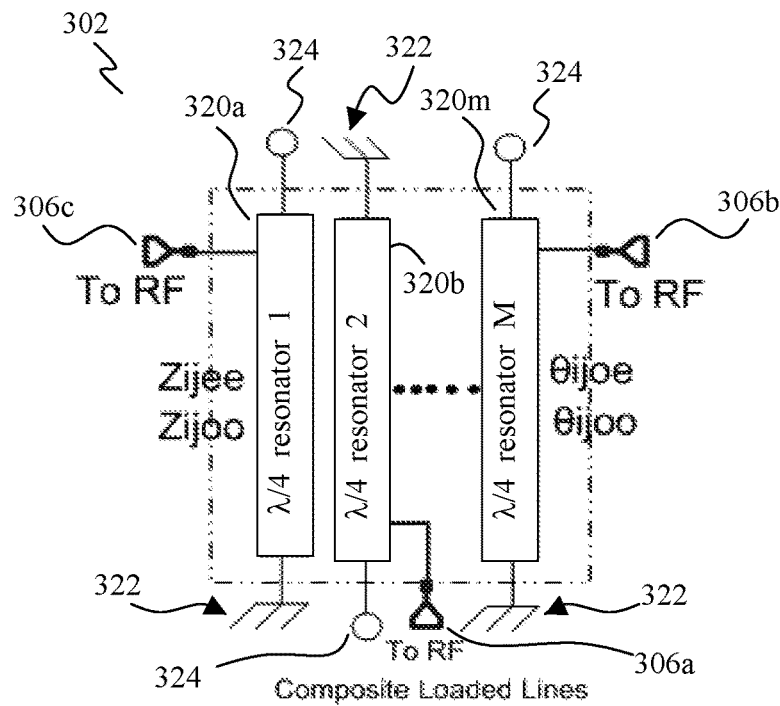
FIG. 3 shows a schematic diagram of a set of composite loaded lines, according to various embodiments.

FIG. 3 shows a schematic diagram of a set of composite loaded lines 302, according to various embodiments, illustrating an example of a type of composite loaded lines for a standing-wave switch (e.g. an SPDT standing-wave switch). The composite loaded lines 302 may be quarter-wavelength (λ/4) composite loaded lines. The composite loaded lines 302 may include a plurality of quarter-wavelength (λ/4) resonators. For example, the composite loaded lines 302 may include a first quarter-wavelength (λ/4) resonator 320a, a second quarter-wavelength (λ/4) resonator 320b, up to an mth (where "m" may be 3, 4 or any higher number) quarter-wavelength (λ/4) resonator 320m. However, it should be appreciated that a single quarter-wavelength resonator may instead be provided.

There may be coupling between or among the different quarter-wave resonators 320a, 320b, 320m. The coupling may be electrical coupling, magnetic coupling or both, which may be implemented using one or more inductors, one or more capacitors or any combination thereof. The coupling may be as illustrated in FIG. 2C. For example, at least one capacitive element (e.g. a capacitor) may be provided between adjacent resonators to effect electrical coupling, while at least one inductive element (e.g. an inductor) may be provided between adjacent resonators to effect magnetic coupling. Further, at least one capacitive element and at least one inductive element may be connected in series or in parallel to each other between adjacent resoator to effect electrical and magnetic coupling. The coupling strength may be strong or weak.

In various embodiments, each resonator 320a, 320b, 320m may be of any loaded format such as periodic transmission loading, capacitor loading or other type, and thus the resonator may not be required to be at least substantially exactly quarter-wavelength but may be shorter than quarter-wavelength. Nevertheless, each resonator 320a, 320b, 320m may be configured to generate a standing wave.

As shown in FIG. 3, a first end of the first resonator 320a may be connected to ground (e.g. a "short" end) 322, while a second end of the first resonator 320a may be connected to a node 324. Similarly, respective first ends of the resonator 320b, 320m may be connected to ground (e.g. "short" ends) 322 while the respective second ends of the resonator 320b, 320m may be connected to respective nodes 324. One or more nodes 324 may be connected to a T/D network (e.g. 204, FIGS. 2A, 2B, 2D, 2E) or may be left unconnected (or in other words the second ends may be "open" ends). For example, at least one node 324 of the first resonator 320a or the mth resonator 320m may be connected to a T/D network, while the node 324 of the second resonator 320b may be open-ended or may be connected to a capacitor.

In various embodiments, the resonators 320a, 320b, 320m may be arranged such that different ends of the respective resonators 320a, 320b, 320m may be positioned on the same side. For example, the second end of the first resonator 320a that is connected to the node 324 may be arranged adjacent to the first end of the second resonator 320b that is connected to ground 322, and so forth.

The switch incorporating the composite loaded lines 302 may include a first port (e.g. an RF port) 306a, a second port (e.g. an RF port) 306b and a third port (e.g. an RF port) 306c coupled to the composite loaded lines 302, where one of these ports may be an input port configured to receive an input signal (e.g. an input RF signal). For example, the first port 306a may be coupled to the second resonator 320b, the second port 306b may be coupled to the mth resonator 320m, while the third port 306c may be coupled to the first resonator 320a.

In various embodiments, the design of the composite loaded lines 302 is to properly set the feed I/O ports 306a, 306b, 306c as RF ports and design the proper coupling between or among the different resonators 320a, 320b, 320m.

While the composite loaded lines 302 have been described in terms of quarter-wavelength (λ/4) composite loaded lines having quarter-wavelength (λ/4) resonators, it should be appreciated that in further embodiments, the composite loaded lines 302 may be half-wavelength (λ/2) composite loaded lines having one or a plurality of half-wavelength (λ/2) resonators. In other words, the quarter-wavelength resonators 320a, 320b, 320m may be replaced by half-wavelength resonators. In further embodiments, the quarter-wavelength resonators 320a, 320b, 320m may be replaced by other types of resonators.

The terms "Zijee", "Zijoo", "θijoe" and "θijoo" may refer to parameters (e.g. odd-mode and even mode impedance) used for analysis based on the even- and odd mode method.

Figure 4:
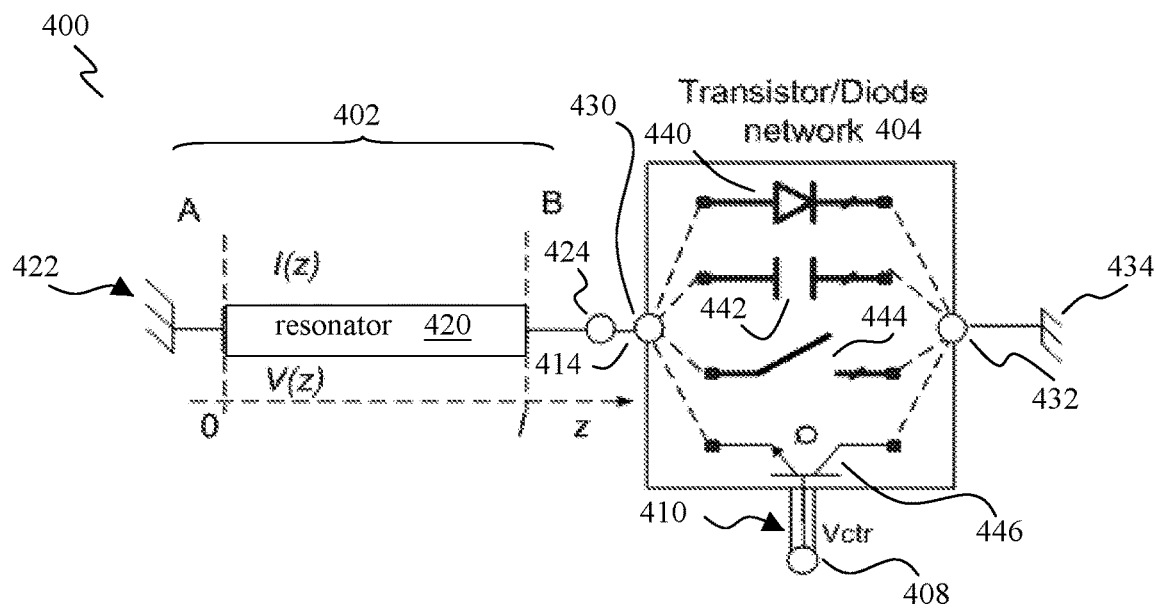
FIG. 4 shows a schematic diagram of a standing-wave switch, according to various embodiments.

FIG. 4 shows a schematic diagram of a standing-wave switch 400, according to various embodiments, illustrating an example of a type of composite loaded lines 402 for a standing-wave switch such as the switch 400. The composite loaded lines 402 may be in the form of a single resonator 420. The composite loaded lines 402 may be quarter-wavelength (λ/4) composite loaded lines connected to a transistor/diode (T/D) network 404 of the switch 400. Therefore, the switch 400 may include a single quarter-wavelength resonator 420 and a loaded T/D network 404. The switch 400 may further include related control circuits (not shown), for example for controlling the T/D network 404.

The resonator 420 may be of any loaded format such as periodic transmission loading, capacitor loading or other type, and thus the resonator 420 may not be required to be at least substantially exactly quarter-wavelength but may be shorter than quarter-wavelength. Nevertheless, the resonator 420 may be configured to generate a standing wave.

A first end of the resonator 420 may be connected to ground (e.g. a "short" end) 422, while a second end of the resonator 420 may be connected to a node 424. The T/D network 404 may include a first node 430 that may be connected to the node 424 of the resonator 420 via an interconnection 414, and a second node 432 that may be connected to ground 434.

The T/D network 404 may include at least one of a diode 440, a capacitor (e.g. a varactor) 442, a switch (e.g. a MEMS switch) 444 or at least one transistor 446. The switch 400 may further include a node 408 and an interconnection 410 connecting the T/D network 404 and the node 408. The node 408 may be connected to a control circuit (not shown) which may provide a control signal, Vctr, to the T/D network 204 to control the operation of the T/D network 404, for example to switch the T/D network 404 between an "on" status or an "off" status. As a non-limiting example, the control signal, Vctr, may be employed to turn on or turn off the transistor 446. The T/D network 404 of the switch 400 may be as described further below, including in the context of various embodiments illustrated in the corresponding figures.

While not shown, two I/O ports (e.g. RF ports) may be provided in the switch 400, coupled to the resonator 420, which may thereby configure the switch 400 as a SPST switch, or three I/O ports (e.g. RF ports) may be provided in the switch 400, coupled to the resonator 420, which may thereby configure the switch 400 as a SPDT switch. The locations of the I/O port connections to the resonator 420 at positions along the resonator 420 from the position "0" (indicated with dotted line "A") to the position "l" (indicated with dotted line "B"), based on electrical or magnetic coupling, may be designed or determined according to bandwidth requirements.

While a quarter-wavelength resonator 420 has been employed in the switch 400, it should be appreciated that the quarter-wavelength resonator 420 may be replaced by a half-wavelength resonator or other types of resonator.

It should be appreciated that a plurality of resonators, for example as described in the context of the composite loaded lines 302 (FIG. 3) may be provided for the composite loaded lines 402.

Figure 5:
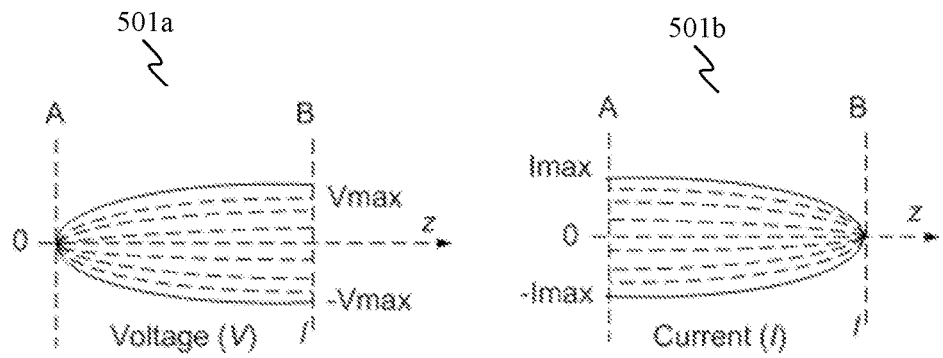
FIG. 5 shows plots of current and voltage distribution for a single quarter-wavelength resonator of a standing-wave switch (SWS), according to various embodiments.

FIG. 5 shows a plot 501*a* of voltage distribution and a plot 501*b* of current distribution for a single quarter-wavelength resonator in composite loaded lines. For example, the plots 501*a*, 501*b* may be applicable to the resonator 420 (FIG. 4), the resonators 620*a*, 620*b* (FIG. 6) or other resonators described herein. At the ground end (represented by the dotted line "A"), the voltage is zero while the absolute current is maximum. At the open-end or the end (represented by the dotted line "B") connected to a transistor/diode (T/D) network, the absolute voltage is maximum while the current is minimum. For a quarter-wavelength SWS, when energy is injected into the composite loaded lines of the switch, the energy may propagate forward waves along the quarter-wave transmission lines or resonators toward the short, where the energy may be reflected into reverse waves. In steady state, the forward waves and the reverse waves superpose to form standing wave.

Figure 6:
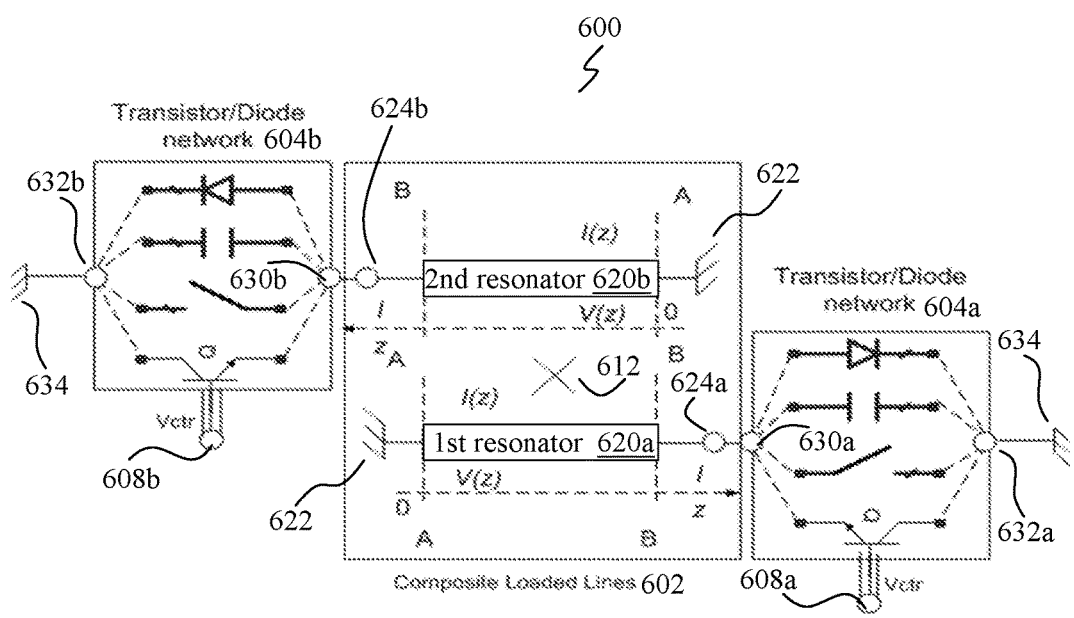
FIG. 6 shows a schematic diagram of a standing-wave switch, according to various embodiments.

FIG. 6 shows a schematic diagram of a standing-wave switch 600, according to various embodiments, illustrating an architecture having coupled quarter-wavelength resonators with loaded transistor/diode networks. The switch 600 may include a first resonator 620*a* and a second resonator 620*b* coupled to each other to form composite loaded lines 602 for size reduction and performance improvement. The coupling, as represented by "X" 612, between the resonators 620*a*, 620*b*, may be electrical coupling, magnetic coupling or both. The coupling may be as illustrated in FIG. 2C. For example, at least one capacitive element (e.g. a capacitor) may be provided between the resonators 620*a*, 620*b* to effect electrical coupling, while at least one inductive element (e.g. an inductor) may be provided between the resonators 620*a*, 620*b* to effect magnetic coupling. Further, at least one capacitive element and at least one inductive element may be connected in series or in parallel to each other between adjacent resoator to effect electrical and magnetic coupling. The resonators 620*a*, 620*b* may be quarter-wavelength or quasi-quarter-wavelength resonators. A quasi-quarter-wavelength resonator may mean a resonator that may operate like a quasi-quarter-wavelength resonator, but which the physical size and the structure may be different from a normal quarter-wavelength resonator.

Respective first ends of the resonators 620*a*, 620*b* may be connected to ground (e.g. a "short" end) 622, while respective second ends of the resonators 620*a*, 620*b* may be connected to respective nodes 624*a*, 624*b*. The resonators 620*a*, 620*b* may be arranged such that different ends of the resonators 620*a*, 620*b* may be positioned on the same side. For example, the second end of the first resonator 620*a* that is connected to the node 624*a* may be arranged adjacent to the first end of the second resonator 620*b* that is connected to ground 622.

The switch 600 may further include a first T/D network 604*a* having a first node 630*a* that may be connected to the node 624*a* of the first resonator 620*a* via an interconnection, and a second node 632*a* that may be connected to ground 634. The switch 600 may further include a second T/D network 604*a* having a first node 630*b* that may be connected to the node 624*b* of the second resonator 620*b* via an interconnection, and a second node 632*b* that may be connected to ground 634. The transistor/diode networks 604*a*, 604*b* connected at the respective open ends or nodes 624*a*, 624*b* of the resonators 620*a*, 620*b* may be or may include a capacitor, a varactor, a diode, a MEMS switch, at least one transistor or any form of combination thereof. Each of the T/D networks 604*a*, 604*b* may be as described in the context of the T/D network 404 (FIG. 4) and/or as described later below, including in the context of various embodiments illustrated in the corresponding figures.

The switch 600 may further include respective nodes 608*a*, 608*b* which may be connected to respective T/D networks 604*a*, 604*b*. The respective nodes 608*a*, 608*b* may be connected to a control circuit (not shown) or separate control circuits (not shown) which may provide the same control signal, Vctr, or different control signals to the respective T/D networks 604*a*, 604*b* to control the operation of the T/D network 604*a*, 604*b*, for example to turn on or turn off respective transistors in the respective T/D networks 604*a*, 604*b*.

While not shown, two I/O ports (e.g. RF ports) may be provided in the switch 600, coupled to the composite loaded lines 602, which may thereby configure the switch 600 as a SPST switch, or three I/O ports (e.g. RF ports) may be provided in the switch 600, coupled to the composite loaded lines 602, which may thereby configure the switch 600 as a SPDT switch. The locations of the I/O port connections to the respective resonators 620*a*, 620*b* at positions along the respective resonators 620*a*, 620*b* from the corresponding position "0" (indicated with dotted line "A") to the position "l" (indicated with dotted line "B"), based on electrical or magnetic coupling, may be designed or determined according to bandwidth requirements and performance requirements.

It should be appreciated that the resonators 620*a*, 620*b* may be replaced by half-wavelength resonators or other types of resonator.

Figure 7:
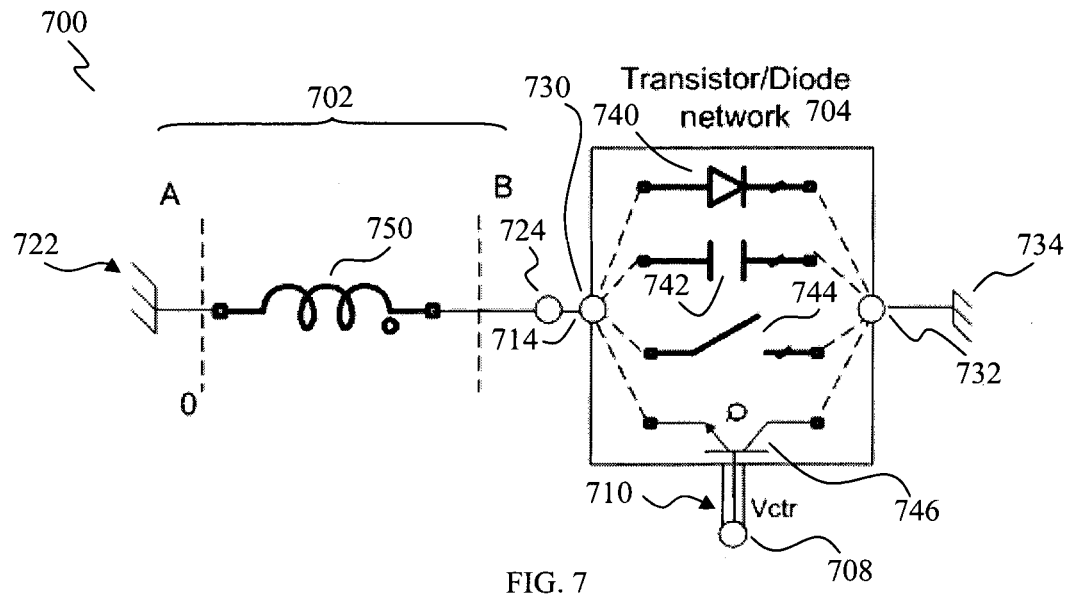
FIG. 7 shows a schematic diagram of a standing-wave switch, according to various embodiments.

FIG. 7 shows a schematic diagram of a standing-wave switch 700, according to various embodiments, illustrating an example of a lumped element type of composite loaded lines 702 for a standing-wave switch. The standing-wave switch 700 may implement the use of one or more lumped elements. For example, an inductor or a spiral inductive element (e.g. spiral inductor) 750 may be employed in the composite loaded lines 702 to replace the transmission line or resonator described above so as to have a more compact form factor. The switch 700 may further include a transistor/diode (T/D) network 704 connected to the inductor 750.

A first end of the inductor 750 may be connected to ground (e.g. a "short" end) 722, while a second end of the inductor 750 may be connected to a node 724. The T/D network 704 may include a first node 730 that may be connected to the node 724 of the inductor 750 via an interconnection 714, and a second node 732 that may be connected to ground 834.

The T/D network 704 may include at least one of a diode 740, a capacitor (e.g. a varactor) 742, a switch (e.g. a MEMS switch) 744 or at least one transistor 746. The switch 700 may further include a node 708 and an interconnection 710 connecting the T/D network 704 and the node 708. The node 708 may be connected to a control circuit (not shown) which may provide a control signal, Vctr, to the T/D network 704 to control the operation of the T/D network 704, for example to switch the T/D network 704 between an "on" status or an "off" status. As a non-limiting example, the control signal, Vctr, may be employed to turn on or turn off the transistor 746. The T/D network 704 of the switch 700 may be as described further below, including in the context of various embodiments illustrated in the corresponding figures.

I/O coupling (e.g. I/O ports) to the inductor or spiral inductive element 750 may be via one or more spiral inductive elements, and/or one or more capacitors connected to the inductor or spiral inductive element 750. The inductor or spiral inductive element 750 and the one or more spiral inductive elements connected thereto may operate like a transformer. The I/O coupling may also be a metal plate coupling to the inductor or spiral inductive element 750.

Figure 8:
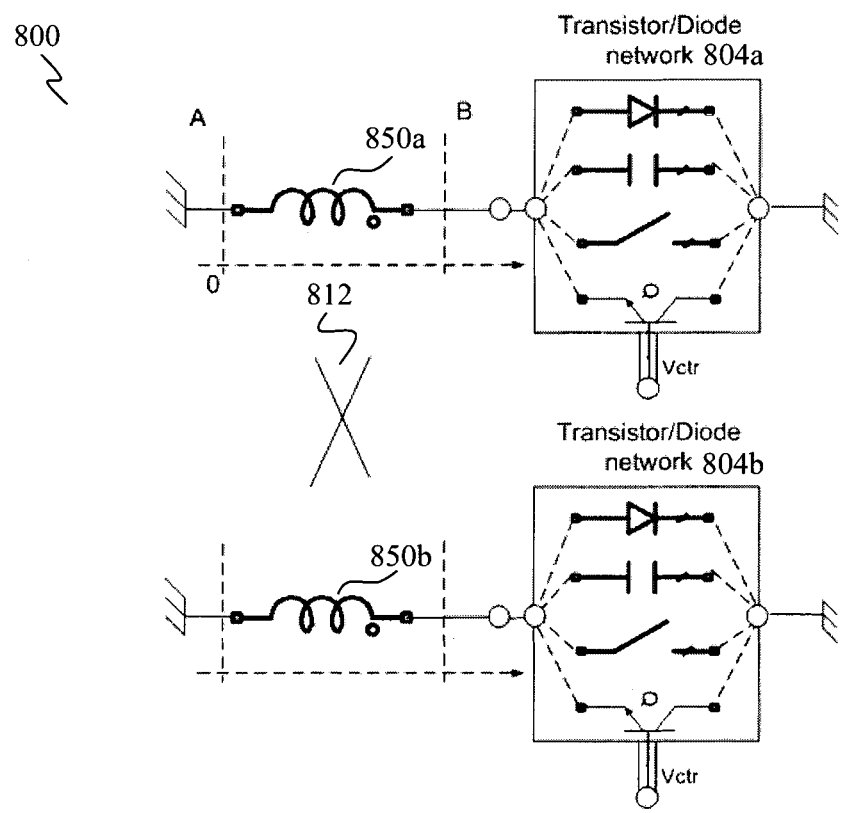
FIG. 8 shows a schematic diagram of a standing-wave switch, according to various embodiments.

FIG. 8 shows a schematic diagram of a standing-wave switch 800, according to various embodiments, illustrating an example architecture employing a lumped element. FIG. 8 shows an example of standing-wave switch implementation using coupled lumped-elements.

The switch 800 may include a first inductor or spiral inductive element (e.g. spiral inductor) 850a and a first T/D network 804a connected to each other, and a second inductor or spiral inductive element (e.g. spiral inductor) 850b and a second T/D network 804b connected to each other. Each of the inductors 850a, 850b may be as described in the context of the inductor 750 (FIG. 7). Each of the T/D network 804a, 804b may be as described in the context of the T/D network 704 (FIG. 7). Accordingly, the first inductor 850a and the first T/D network 804a connected to each other may be as described in the context of the switch 700 (FIG. 7). Similarly, the second inductor 850b and the second T/D network 804b connected to each other may be as described in the context of the switch 700 (FIG. 7).

The first inductor 850a and the second inductor 850b may be coupled to each other. The coupled inductors 850a, 850b may define a transformer. The coupling, as represented by "X" 812, between the inductors 850a, 850b, may be electrical coupling, magnetic coupling or both. The coupling may be as illustrated in FIG. 2C. For example, at least one capacitive element (e.g. a capacitor) may be provided between the inductors 850a, 850b to effect electrical coupling, while at least one inductive element (e.g. an inductor) may be provided between the inductors 850a, 850b to effect magnetic coupling. Further, at least one capacitive element and at least one inductive element may be connected in series or in parallel to each other between adjacent resoator to effect electrical and magnetic coupling.

The coupled inductors 850a, 850b, which may defined a transformer may be employed to replace the transmission line or resonator described above in the composite loaded lines so as to have a more compact form factor.

I/O coupling (e.g. I/O ports) to the inductors or spiral inductive elements 850a, 850b may be via one or more spiral inductive elements, and/or one or more capacitors connected to the inductors 850a, 850b. Each inductor or spiral inductive element 850a, 850b and the one or more spiral inductive elements connected thereto may operate like a transformer. The I/O coupling may also be a metal plate coupling to each inductor or spiral inductive element 850a, 850b.

In various embodiments, the coupled inductors 850a, 850b or transformer may be a three, four or multiple-port transformer with proper connections to the I/O ports and/or the T/D networks 804a, 804b.

Non-limiting examples of transistor/diode networks that may be employed in the standing-wave switch of various embodiments will now be described with reference to FIGS. 9A to 9D, 10A to 10C, 11A to 11C and 12A to 12C.

Figure 9A:
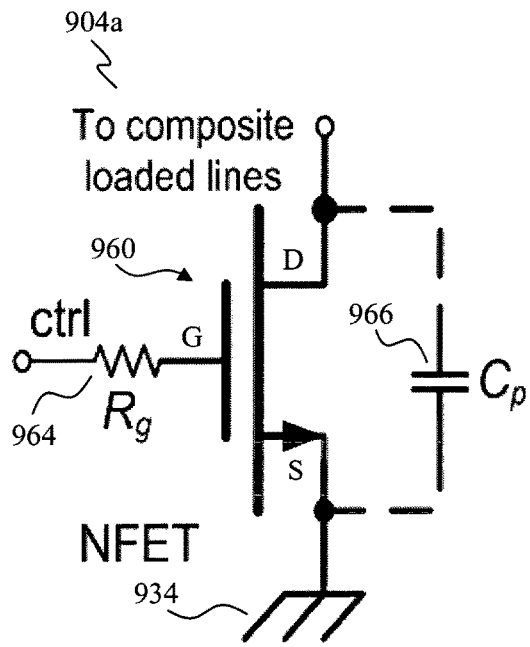
FIGS. 9A to 9D show schematic diagrams of transistor/diode networks with NFET (n-channel field effect transistor), according to various embodiments.

FIG. 9A shows a schematic diagram of a transistor/diode (T/D) network 904a having an NFET (n-channel field effect transistor) 960. The NFET 960 includes a source (S) terminal connected to ground 934, a drain (D) terminal that may be connected to the composite loaded lines as described herein, and a gate (G) terminal that may receive a control signal, "ctrl" (or Vctr) via a gate resistor, $R_g$, 964 connected to the gate terminal. The gate terminal may be connected to a control circuit (not shown) that may provide the control signal, ctrl. The control signal, ctrl, may turn on or turn off the NFET 960. A capacitor (or capacitor network), $C_p$, 966 may be connected between the drain (D) terminal and the source (S) terminal of the NFET transistor 960 to enhance the SWS switch isolation performance.

Figure 9B:
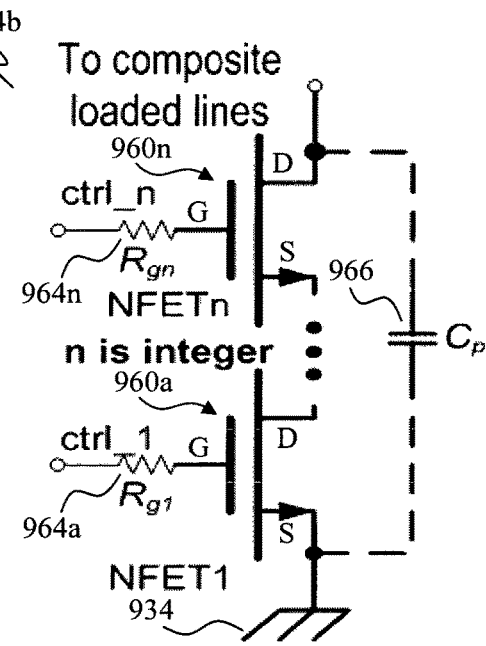

FIG. 9B shows a schematic diagram of a transistor/diode (T/D) network 904b having a plurality of NFETs (n-channel field effect transistors) connected in series. For example, the T/D network 904b may include a first NFET (NFET1) 960a, up to an nth (where "n" is an integer, for example 2, 3, 4 or any higher number) NFET (NFETn) 960n.

The plurality of NFETs 960a, 960n may be connected in series such that the source (S) terminal of one NFET may be connected to the drain (D) terminal of an adjacent NFET. Further, the source (S) terminal of the first NFET 960a may be connected to ground 934 while the drain (D) terminal of the nth NFET 960n may be connected to the composite loaded lines as described herein. The respective gate (G) terminals of the plurality of NFETs 960a, 960n may receive respective control signals, "ctrl_1" (or Vctr_1), "ctrl_n" (or Vctr_n) via respective gate resistors, $R_{g1}$ 964a, $R_{gn}$ 964n. The respective control signals, ctrl_1 and ctrl_n, may turn on or turn off the respective NFETs 960a, 960n. In various embodiments, ctrl_1 may be at least substantially the same as ctrl_n or may be different. The respective gate (G) terminals may be connected to a control circuit (not shown) or respective control circuits (not shown) that may provide the control signals, ctrl_1, ctrl_n. Further, the respective gate (G) terminals may receive n control signals, just one control signal, or several control signals (e.g. a number less than n).

A capacitor (or capacitor network), $C_p$, 966 may be connected between the drain (D) terminal of the nth NFET 960n and the source (S) terminal of the first NFET 960a.

In various embodiments, the plurality of NFETs (e.g. 960a, 960n) of the T/D network 904b may be identical or may be different (e.g. in terms of size).

Figure 9C:
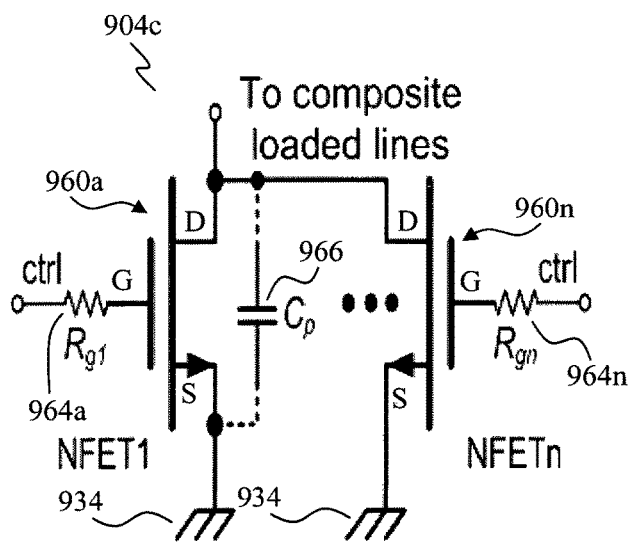

FIG. 9C shows a schematic diagram of a transistor/diode (T/D) network 904c having a plurality of NFETs (n-channel field effect transistors) connected in parallel. For example, the T/D network 904c may include a first NFET (NFET1) 960a, up to an nth (where "n" is an integer, for example 2, 3, 4 or any higher number) NFET (NFETn) 960n.

The plurality of NFETs 960a, 960n may be connected in parallel such that the respective source (S) terminals of the NFETs 960a, 960n may be connected to ground 934, while the respective drain (D) terminals of the NFETs 960a, 960n may be connected to the composite loaded lines as described herein. The respective gate (G) terminals of the plurality of NFETs 960a, 960n may receive a control signal, "ctrl" (or Vctr) via respective gate resistors, $R_{g1}$ 964a, $R_{gn}$ 964n or not via the respective gate resistors, $R_{g1}$ 964a, $R_{gn}$ 964n. It should be appreciated that the respective gate resistors, $R_{g1}$ 964a, $R_{gn}$ 964n, may be optional. The gate terminals may be connected to a control circuit (not shown) that may provide the control signal, ctrl. The control signal, ctrl, may turn on or turn off the respective NFETs 960a, 960n.

A capacitor (or capacitor network), $C_p$, 966 may be connected between the drain (D) terminals and the source (S) terminals of the plurality of NFETs 960a, 960n.

In various embodiments, the plurality of nFETs (e.g. 960a, 960n) of the T/D network 904c may be identical or may be different (e.g. in terms of size).

Figure 9D:
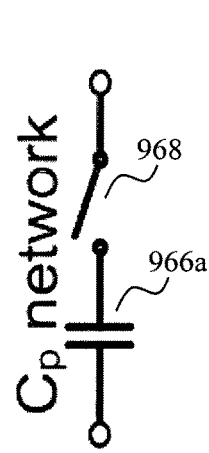

FIG. 9D shows a schematic diagram of the capacitor network 966 that may be employed for the T/D networks 904a, 904b, 904c. The $C_p$ network 966 may include a single capacitor 966a in series with a switch 968. However, it should be appreciated that the $C_p$ network 966 may also be a single capacitor or a capacitor network (e.g. having a plurality of capacitors), or a capacitor network (e.g. having a plurality of capacitors) in series with a switch. The capacitor (e.g. 966a) employed in the $C_p$ network 966 may be various types of capacitors, including varactors. The switch (e.g. 968) in the $C_p$ network 966 may be any type of switch, or may be of the same type of any T/D network as described herein or a different type of T/D network.

The NFET transistors (e.g. 960, 960a, 960n) described in the context of FIGS. 9A to 9C may have a floating bulk, or some of the NFET transistors may have a floating bulk, while some other NFET transistors may not have a floating bulk. The gate resistors (e.g. 964, 964a, 964n) in the NFET transistor networks described in the context of FIGS. 9A to 9C may be set to any appropriate values, including 0. All the gate resistors (e.g. 964, 964a, 964n) in the NFET transistor networks described in the context of FIGS. 9A to 9C may not necessary be identical. The $C_p$ network 966 described in the context of FIGS. 9A to 9C may be optional.

Figure 10A:
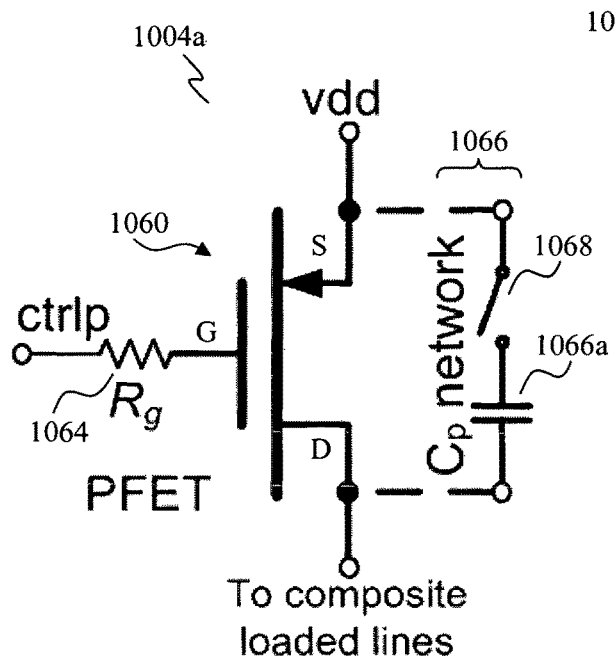
FIGS. 10A to 10C show schematic diagrams of transistor/diode networks with PFET (p-channel field effect transistor), according to various embodiments.

FIG. 10A shows a schematic diagram of a transistor/diode (T/D) network 1004a having a PFET (p-channel field effect transistor) 1060. The PFET 1060 includes a source (S) terminal connected to a voltage supply, vdd, a drain (D) terminal that may be connected to the composite loaded lines as described herein, and a gate (G) terminal that may receive a control signal, "ctrlp" (or Vctr) via a gate resistor, $R_g$, 1064 connected to the gate terminal. The gate terminal may be connected to a control circuit (not shown) that may provide the control signal, ctrlp. The control signal, ctrlp, may turn on or turn off the PFET 1060. A capacitor network, $C_p$ network 1066, may be connected between the drain (D) terminal and the source (S) terminal of the PFET transistor 1060 to enhance the SWS switch isolation performance. The $C_p$ network 1066 may include at least one capacitor 1066a connected in series with a switch 1068. The $C_p$ network 1066 may be as described in the context of the $C_p$ network 966 (FIG. 9D).

Figure 10B:
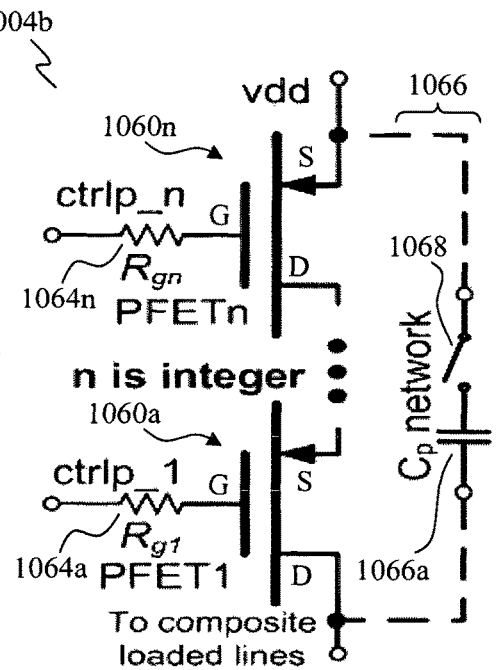

FIG. 10B shows a schematic diagram of a transistor/diode (T/D) network 1004b having a plurality of PFETs (p-channel field effect transistors) connected in series. For example, the T/D network 1004b may include a first PFET (PFET1) 1060a, up to an nth (where "n" is an integer, for example 2, 3, 4 or any higher number) PFET (PFETn) 1060n.

The plurality of PFETs 1060a, 1060n may be connected in series such that the drain (D) terminal of one PFET may be connected to the source (S) terminal of an adjacent PFET. Further, the source (S) terminal of the nth PFET 1060n may be connected to a voltage supply, vdd, while the drain (D) terminal of the first PFET 1060a may be connected to the composite loaded lines as described herein. The respective gate (G) terminals of the plurality of PFETs 1060a, 1060n may receive respective control signals, "ctrlp_1" (or Vctr_1), "ctrlp_n" (or Vctr_n) via respective gate resistors, $R_{g1}$ 1064a, $R_{gn}$ 1064n. The respective control signals, ctrl_1 and ctrl_n, may turn on or turn off the respective PFETs 1060a, 1060n. In various embodiments, ctrlp_1 may be at least substantially the same as ctrlp_n or may be different. The respective gate (G) terminals may be connected to a control circuit (not shown) or respective control circuits (not shown) that may provide the control signals, ctrlp_1, ctrlp_n. Further, the respective gate (G) terminals may receive n control signals, just one control signal, or several control signals (e.g. a number less than n).

A capacitor network, $C_p$ network 1066, may be connected between the drain (D) terminal of the first PFET 1060a and the source (S) terminal of the nth PFET 1060n. The $C_p$ network 1066 may include at least one capacitor 1066a connected in series with a switch 1068. The $C_p$ network 1066 may be as described in the context of the $C_p$ network 966 (FIG. 9D).

In various embodiments, the plurality of PFETs (e.g. 1060a, 1060n) of the T/D network 1004b may be identical or may be different (e.g. in terms of size).

Figure 10C:
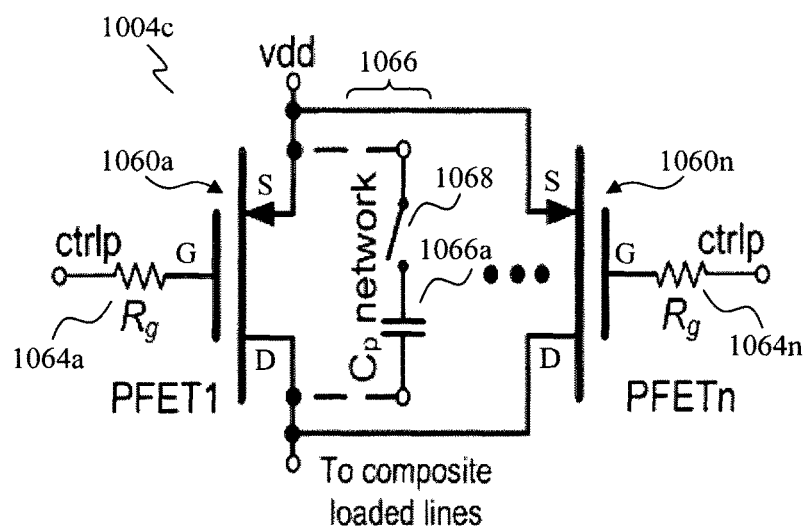

FIG. 10C shows a schematic diagram of a transistor/diode (T/D) network 1004c having a plurality of PFETs (p-channel field effect transistors) connected in parallel. For example, the T/D network 1004c may include a first PFET (PFET1) 1060a, up to an nth (where "n" is an integer, for example 2, 3, 4 or any higher number) PFET (PFETn) 1060n.

The plurality of PFETs 1060a, 1060n may be connected in parallel such that the respective source (S) terminals of the PFETs 1060a, 1060n may be connected to a voltage supply, vdd, while the respective drain (D) terminals of the PFETs 1060a, 1060n may be connected to the composite loaded lines as described herein. The respective gate (G) terminals of the plurality of PFETs 1060a, 1060n may receive a control signal, "ctrlp" (or Vctr) via respective gate resistors, $R_g$ 1064a, $R_g$ 1064n or not via the respective gate resistors, $R_g$ 1064a, $R_g$ 1064n. It should be appreciated that the respective gate resistors, $R_g$ 1064a, $R_g$ 1064n, may be optional. The gate terminals may be connected to a control circuit (not shown) that may provide the control signal, ctrlp. The control signal, ctrlp, may turn on or turn off the respective PFETs 1060a, 1060n.

A capacitor network, $C_p$ network 1066, may be connected between the drain (D) terminals and the source (S) terminals of the plurality of PFETs 1060a, 1060n. The $C_p$ network 1066 may include at least one capacitor 1066a connected in series with a switch 1068. The $C_p$ network 1066 may be as described in the context of the $C_p$ network 966 (FIG. 9D).

In various embodiments, the plurality of PFETs (e.g. 1060a, 1060n) of the T/D network 1004c may be identical or may be different (e.g. in terms of size).

The PFET transistors (e.g. 1060, 1060a, 1060n) described in the context of FIGS. 10A to 10C may have a floating bulk, or some of the PFET transistors may have a floating bulk, while some other PFET transistors may not have a floating bulk. The gate resistors (e.g. 1064, 1064a, 1064n) in the PFET transistor networks described in the context of FIGS. 10A to 10C may be set to any appropriate values, including 0. All the gate resistors (e.g. 1064, 1064a, 1064n) in the PFET transistor networks described in the context of FIGS. 10A to 10C may not necessary be identical. The $C_p$ network 1066 described in the context of FIGS. 10A to 10C may be optional. In various embodiments, the $C_p$ network 1066 may be a single capacitor or a capacitor network (e.g. having a plurality of capacitors), or may be a single capacitor in series with a switch or a capacitor network (e.g. having a plurality of capacitors) in series with a switch. The capacitor (e.g. 1066a) employed in the $C_p$ network 1066 may be various types of capacitors, including varactors. The switch (e.g. 1068) in the $C_p$ network 1066 may be any type of switch, or may be of the same type of any T/D network as described herein or a different type of T/D network.

FIG. 11A shows a schematic diagram of a transistor/diode (T/D) network 1104a having an npn transistor 1160. The npn transistor 1160 includes an emitter (E) terminal connected to ground 1134, a collector (C) terminal that may be connected to the composite loaded lines as described herein, and a base (B) terminal that may receive a control signal, "ctrl" (or Vctr) via a base resistor, $R_b$, 164 connected to the base terminal. The base terminal may be connected to a control circuit (not shown) that may provide the control signal, ctrl. The control signal, ctrl, may turn on or turn off the npn transistor 1160. A capacitor network, $C_p$ network 1166, may be connected between the collector (C) terminal and the emitter (E) terminal of the npn transistor 1160 to enhance the SWS switch isolation performance. The $C_p$ network 1166 may include at least one capacitor 1166a connected in series with a switch 1168. The $C_p$ network 1166 may be as described in the context of the $C_p$ network 966 (FIG. 9D).

FIG. 11B shows a schematic diagram of a transistor/diode (T/D) network 1104b having a plurality of npn transistors connected in series. For example, the T/D network 1104b may include a first npn transistor (npn$_1$) 1160a, up to an nth (where "n" is an integer, for example 2, 3, 4 or any higher number) npn transistor (npn$_n$) 1160n.

The plurality of npn transistors 1160a, 1160n may be connected in series such that the emitter (E) terminal of one npn transistor may be connected to the collector (C) terminal of an adjacent npn transistor. Further, the emitter (E) terminal of the first npn transistor 1160a may be connected to ground 1134 while the collector (C) terminal of the nth npn transistor 1160n may be connected to the composite loaded lines as described herein. The respective base (B) terminals of the plurality of npn transistors 1160a, 1160n may receive respective control signals, "ctrl_1" (or Vctr_1), "ctrl_n" (or Vctr_n) via respective base resistors, $R_{b1}$ 1164a, $R_{bn}$ 1164n. The respective control signals, ctrl_1 and ctrl_n, may turn on or turn off the respective npn transistors 1160a, 1160n. In various embodiments, ctrl_1 may be at least substantially the same as ctrl_n or may be different. The respective base (B) terminals may be connected to a control circuit (not shown) or respective control circuits (not shown) that may provide the control signals, ctrl_1, ctrl_n. Further, the respective base (B) terminals may receive n control signals, just one control signal, or several control signals (e.g. a number less than n).

A capacitor network, $C_p$ network 1166, may be connected between the collector (C) terminal of the nth npn transistor 1160n and the emitter (E) terminal of the first npn transistor 1160a. The $C_p$ network 1166 may include at least one capacitor 1166a connected in series with a switch 1168. The $C_p$ network 1166 may be as described in the context of the $C_p$ network 966 (FIG. 9D).

In various embodiments, the plurality of npn transistors (e.g. 1160a, 1160n) of the T/D network 1104b may be identical or may be different (e.g. in terms of size).

FIG. 11C shows a schematic diagram of a transistor/diode (T/D) network 1104c having a plurality of npn transistors connected in parallel. For example, the T/D network 1104c may include a first npn transistor (npn$_1$) 1160a, up to an nth (where "n" is an integer, for example 2, 3, 4 or any higher number) npn transistor (npn$_n$) 1160n.

The plurality of npn transistors 1160a, 1160n may be connected in parallel such that the respective emitter (E) terminals of the npn transistors 1160a, 1160n may be connected to ground 1134, while the respective collector (C) terminals of the npn transistors 1160a, 1160n may be connected to the composite loaded lines as described herein. The respective base (B) terminals of the npn transistors 1160a, 1160n may receive a control signal, "ctrl" (or Vctr) via respective base resistors, $R_b$ 1164a, $R_b$ 1164n or not via the respective base resistors, $R_b$ 1164a, $R_b$ 1164n. It should be appreciated that the respective gate resistors, $R_b$ 1164a, $R_b$ 1164n, may be optional. The base terminals may be connected to a control circuit (not shown) that may provide the control signal, ctrl. The control signal, ctrl, may turn on or turn off the respective npn transistors 1160a, 1160n.

A capacitor network, $C_p$ network 1166, may be connected between the collector (C) terminals and the emitter (E) terminals of the plurality of npn transistors 1160a, 1160n. The $C_p$ network 1166 may include at least one capacitor 1166a connected in series with a switch 1168. The $C_p$ network 1166 may be as described in the context of the $C_p$ network 966 (FIG. 9D).

In various embodiments, the plurality of npn transistors (e.g. 1160a, 1160n) of the T/D network 1104c may be identical or may be different (e.g. in terms of size).

The base resistors (e.g. 1164, 1164a, 1164n) in the npn transistor networks described in the context of FIGS. 11A to 11C may be set to any appropriate values, including 0. All the base resistors (e.g. 1164, 1164a, 1164n) in the npn transistor networks described in the context of FIGS. 11A to 11C may not necessary be identical. The $C_p$ network 1166 described in the context of FIGS. 11A to 11C may be optional. In various embodiments, the $C_p$ network 1166 may be a single capacitor or a capacitor network (e.g. having a plurality of capacitors), or may be a single capacitor in series with a switch or a capacitor network (e.g. having a plurality of capacitors) in series with a switch. The capacitor (e.g. 1166a) employed in the $C_p$ network 1166 may be various types of capacitors, including varactors. The switch (e.g. 1168) in the $C_p$ network 1166 may be any type of switch, or may be of the same type of any T/D network as described herein or a different type of T/D network.

In various embodiments, the npn transistors (e.g. 1160, 1160a, 1160n) described in the context of FIGS. 11A to 11C may be replaced with pnp transistors. When employing pnp transistors, the emitter (E) terminals of the pnp transistors may be connected to a voltage supply, vdd, while the collector (C) terminals may be connected to the composite loaded lines as described herein.

Figure 12A:
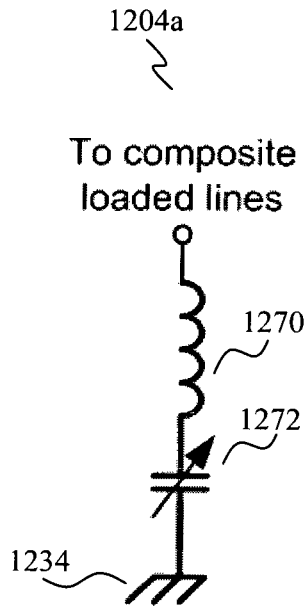
FIGS. 12A to 12C show schematic diagrams of transistor/diode networks, according to various embodiments.

FIG. 12A shows a schematic diagram of a transistor/diode (T/D) network 1204a having an inductor 1270 connected in series with a capacitor 1272. The LC series network may be connected with one port to ground 1234, while the other may be connected to the composite loaded lines as described herein. In various embodiments, the inductor 1270 and/or the capacitor 1272 may be variable. In various embodiments, the inductor 1270 may be one or more spiral inductors, or a transmission line, or one or more transformers or any combination thereof.

Figure 12B:
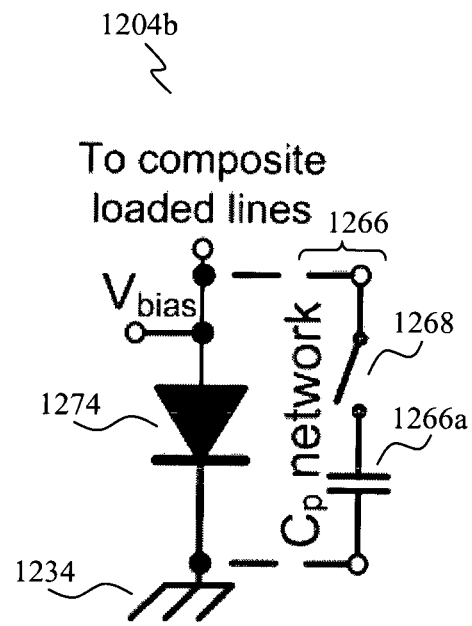

FIG. 12B shows a schematic diagram of a transistor/diode (T/D) network 1204b having a diode 1274 connected between the composite loaded lines as described herein and ground 1234. A voltage, $V_{bias}$, may be used to control the operation of the diode 1274 to an "on" status or an "off" status. The voltage, $V_{bias}$, may be provided by a control circuit (not shown). A capacitor network, $C_p$ network 1266, may be connected in parallel with the diode 1274. The $C_p$ network 1266 may include at least one capacitor 1266a connected in series with a switch 1268. The $C_p$ network 1266 may be as described in the context of the $C_p$ network 966 (FIG. 9D). The $C_p$ network 1266 may be optional.

Figure 12C:
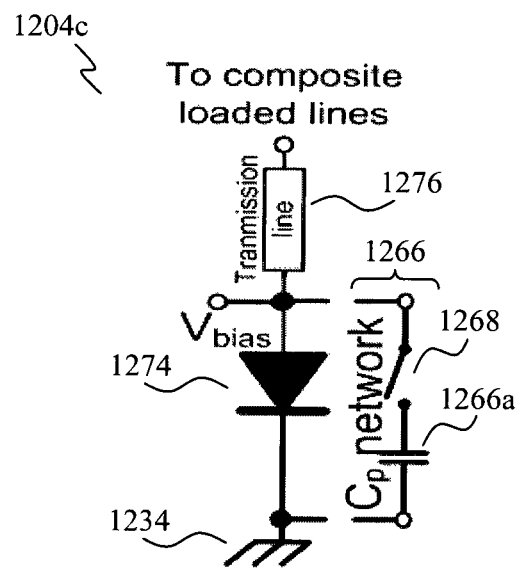

FIG. 12C shows a schematic diagram of a transistor/diode (T/D) network 1204c having a diode 1274 connected in series with a transmission line or transmission line section 1276. The diode 1274 and the transmission line section 1276 may be connected between the composite loaded lines as described herein and ground 1234. A voltage, $V_{bias}$, may be used to control the operation of the diode 1274 to an "on" status or an "off" status. The voltage, $V_{bias}$, may be provided by a control circuit (not shown). A capacitor network, $C_p$ network 1266, may be connected in parallel with the diode 1274. The $C_p$ network 1266 may include at least one capacitor 1266a connected in series with a switch 1268. The $C_p$ network 1266 may be as described in the context of the $C_p$ network 966 (FIG. 9D). The $C_p$ network 1266 may be optional.

In various embodiments, the $C_p$ network 1266 may be a single capacitor or a capacitor network (e.g. having a plurality of capacitors), or may be a single capacitor in series with a switch or a capacitor network (e.g. having a plurality of capacitors) in series with a switch. The capacitor (e.g. 1266a) employed in the $C_p$ network 1266 may be various types of capacitors, including varactors. The switch (e.g. 1268) in the $C_p$ network 1266 may be any type of switch, or may be of the same type of any T/D network as described herein or a different type of T/D network.

FIGS. 9A to 9D, 10A to 10C, 11A to 11C and 12A to 12C illustrate some non-limiting examples of T/D networks that may be employed for the standing-wave switch of various embodiments. However, it should be appreciated that T/D networks that may be employed may not be limited to the forms presented in the above-mentioned embodiments. In various embodiments, the transistor/diode network may be different types of diodes, MEMS switches, transistors, resistors or their combination network. Further, the diodes, MEMS switches, transistor, resistors or their combination network may be connected with different types of capacitors in series or in parallel.

Figure 13A:
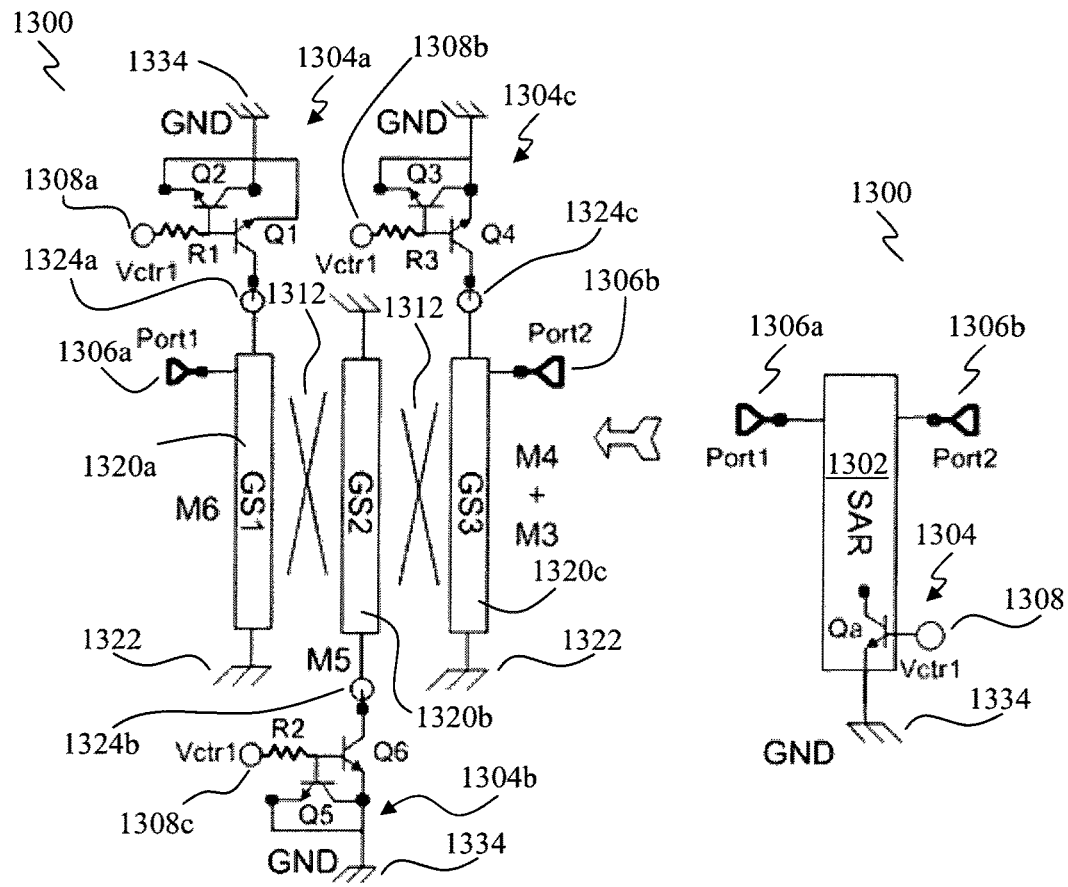
FIGS. 13A to 13C show schematic diagrams of a standing-wave switch and its corresponding operations, according to various embodiments.
Figure 13B:
Figure 13C:

FIGS. 13A to 13C show schematic diagrams of a standing-wave switch 1300 and its corresponding operations, according to various embodiments. FIG. 13A illustrates a topology of a Single-Pole-Single-Throw (SPST) standing-wave switch including one (set of) composite loaded lines 1302, in the form of a switchable artificial resonator (SAR) and two input/output ports (e.g. Port1 1306a and Port2 1306b) coupled to the SAR 1302. An input signal (e.g. RF signal) may be received via either Port1 1306a or Port2 1306b. The switch 1300 further includes at least one transistor/diode (T/D) network (illustrated as a transistor group Qa) 1304 coupled between the SAR 1302 and ground (GND) 1334. The switch 1300 may further include a node 1308, which may be connected to a control circuit (not shown) which may provide a control signal, Vctr1, to the transistor/diode (T/D) network 1304 to control the operation of the T/D network 1304, for example to switch the T/D network 1304 between an "on" status or an "off" status.

In details, the SAR 1302 may include a plurality of transmission lines, in the form of ground stubs. For illustration purposes, three ground stubs are shown in FIG. 13A and the switch 1300 will be described based on such topology. However, it should be appreciated that any number of ground stubs may be employed. The SAR 1302 may include a first ground stub (GS1) 1320a, a second ground stub (GS2) 1320b, and a third ground stub (GS3) 1320c. Port1 1306a may be coupled to the first ground stub 1320a, while Port2 1306b may be coupled to the third ground stub 1320c.

There may be coupling, as represented by "X" 1312, between or among the different ground stubs 1320a, 1320b, 1320c. The coupling may be electrical coupling, magnetic coupling or both, which may be implemented using one or more inductors, one or more capacitors or any combination thereof. The coupling may be as illustrated in FIG. 2C. For example, at least one capacitive element (e.g. a capacitor) may be provided between adjacent ground stubs to effect electrical coupling, while at least one inductive element (e.g. an inductor) may be provided between adjacent ground stubs to effect magnetic coupling. Further, at least one capacitive element and at least one inductive element may be connected in series or in parallel to each other between adjacent ground stubs to effect electrical and magnetic coupling.

In various embodiments, the three ground stubs 1320a, 1320b, 1320c used in the switchable artificial resonators may be defined in metal layers M6, M5 and a combination of metal layers M4 and M3 (M4+M3), respectively. The three ground stubs (GS1, GS2 and GS3) 1320a, 1320b, 1320c, which may be inter-digitally coupled to each other in broadside, may be employed to form or define the SAR 1302. By employing a plurality of transmission lines or ground stubs 1320a, 1320b, 1320c coupled to each other, the SAR 1302 may be much shorter and may have a lower loss as compared to the smallest transmission line resonator of a quarter-wavelength.

As shown in FIG. 13A, a first end of the first ground stub 1320a may be connected to ground (e.g. a "short" end) 1322, while a second end of the first ground stub 1320a may be connected to a node 1324a. Similarly, respective first ends of the ground stubs 1320b, 1320c may be connected to ground (e.g. "short" ends) 1322 while the respective second ends of the ground stubs 1320b, 1320c may be connected to respective nodes 1324b, 1324c, as open ends. Each node 1324a, 1324b, 1324c may be connected to a respective T/D network 1304a, 1304b, 1304c. The respective T/D networks 1304a, 1304b, 1304c may be coupled between the respective ground stubs 1320a, 1320b, 1320c and ground (GND) 1334. The respective T/D networks 1304a, 1304b, 1304c may also be coupled to respective nodes 1308a, 1308b, 1308c of the switch 1300, which may be connected to one or more control circuits (not shown) which may provide a respective control signal, Vctr1, to the respective T/D networks 1304a, 1304b, 1304c to control the operation of the respective T/D networks 1304a, 1304b, 1304c, for example to switch the respective T/D networks 1304a, 1304b, 1304c between an "on" status or an "off" status.

Each T/D network 1302a may include two transistors (e.g. npn transistors, e.g. BJT transistor LN232) and a resistor. Using the T/D network 1304a as an example, the T/D network 1304a may include a transistor Q1 having a collector (C) terminal connected to the node 1324a and an emitter (E) terminal that is connected to the emitter (E) terminal and the collector (C) terminal of the transistor Q2 as well as to ground (GND) 1334. The base (B) terminals of the transistors Q1, Q2 may be coupled together and connected to the node 1308a via a base resistor, R1. Therefore, the open end of the first ground stub 1320a may be connected to transistors Q1, Q2, the open end of the second ground stub 1320b may be connected to transistors Q5, Q6, while the open end of the third ground stub 1320c may be connected to transistors Q3, Q4. It should be appreciated that the transistors Q2, Q3 and Q5 may be dummy transistors.

For a single ground stub 1320a, 1320b, 1320c, incident waves at a fundamental resonant frequency may be at least substantially completely reflected with an inverted phase, thereby forming a standing wave, with a maximum absolute voltage amplitude at the open-end of the ground stub and a minimum voltage swing at the shorted end of the ground stub. For example, the voltage distribution of the ground stub in a quarter-wavelength transmission line or resonator is always zero voltage at the ground end, while the open-end may be a negative or positive maximum voltage, Vmax.

FIGS. 13B and 13C show an operation mechanism of the switch 1300. With the collector (C) terminals of the respective transistors Q1, Q4, Q6 connected to the open-ends of the respective ground stubs (which in various embodiments may be quarter-wave resonators) 1320a, 1320c, 1320b, the operation condition may be changed by setting the "base" voltage at "Vctr1".

As shown in FIG. 13B, when the transistors Q1 to Q6 are in an "off" condition, the switchable artificial resonator (SAR) 1302 may operate in the "on" condition, i.e. operating at the frequency of interest with the parasitic capacitance Ct of the transistor Q1/Q4/Q6. Thus, the SPST switch 1300 may be "on" in the resonant frequency range.

As shown in FIG. 13C, when the transistors Q1 to Q6 are in an "on" condition, the switchable artificial resonator (SAR) 1302 may operate in the "off" condition, i.e. the respective open ends of the ground stubs 1320a, 1320b, 1320c may be shorted to ground through the "on" resistor, Ron, of the transistor Q1/Q4/Q6. Thus, the switch 1300 may operate in the "off" condition.

The control logic of the switch of various embodiments, including the switch 1300, may be reversed as compared to conventional switch designs using MOS transistors, where the conventional switch is "on" when the series switch transistor is "on" and the switch is "off" when the series switch transistor is "off". Therefore, the parasitic capacitance to ground of the conventional switch transistors must be reduced so as to avoid serious insertion loss degradation. However, for the switch (e.g. 1300) of various embodiments, it may not be necessary to reduce the parasitic capacitance to ground of the transistor Q1/Q4/Q6.

Table 1 below shows a summary of the switch status versus the transistor status for the switch of various embodiments and a conventional switch.

TABLE 1

Control logic and the corresponding status of the switch of various embodiments and a conventional switch with a series switch transistor

| Control logic | Status of switch of various embodiments | | Status of conventional switch with series switch transistor | |
|---|---|---|---|---|
| | Transistor | Switch | Transistor | Switch |
| 1 | On | Off | On | On |
| 0 | Off | On | Off | Off |

As described above, the switch (e.g. 1300) and the transistor, and therefore the T/D network (e.g. 1304a, 1304b, 1304c) may have their respective "on" and "off" status. In various embodiments, in relation to the switch, in the "on" status, a signal (e.g. an RF signal) may propagate or pass through a path through the composite loaded lines (or transmission line arrangement), while in the "off" status, the signal may not pass through the path. In relation to the transistor, the "on" status means that the transistor is turned on (e.g. the gate or base voltage is turned on) while the other terminals of the transistor may be properly biased, while the "off" status means that the transistor is turned off (e.g. the gate or base voltage is turned off) while the other terminals of the transistor may be properly biased.

Accordingly, when the switch is "on", the switch is tuned on, while the transistors of the T/D network in the standing wave resonator or switch are "off" and the open-end side of the transmission line resonator is close to an "open" status. When the switch is "off", the switch is turned off, while the transistors of the T/D network in the standing wave resonator or switch are "on" and the open-end side of the transmission line resonator is close to a "short" status.

It should be appreciated that the descriptions in the context of FIGS. 13A to 13C may be applicable to various embodiments as described herein and illustrated in the corresponding figures.

Figure 14A:
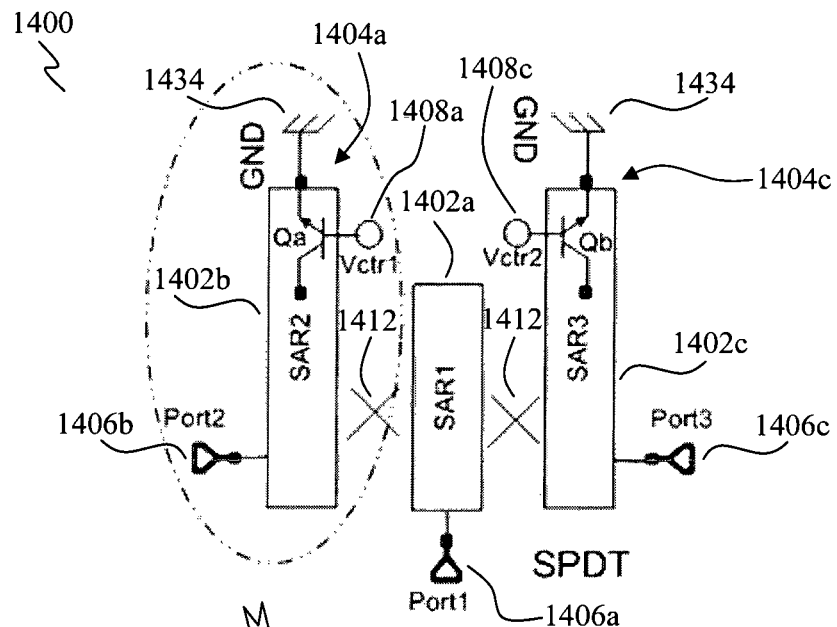
FIGS. 14A and 14B show schematic diagrams of a standing-wave switch, according to various embodiments.
Figure 14B:
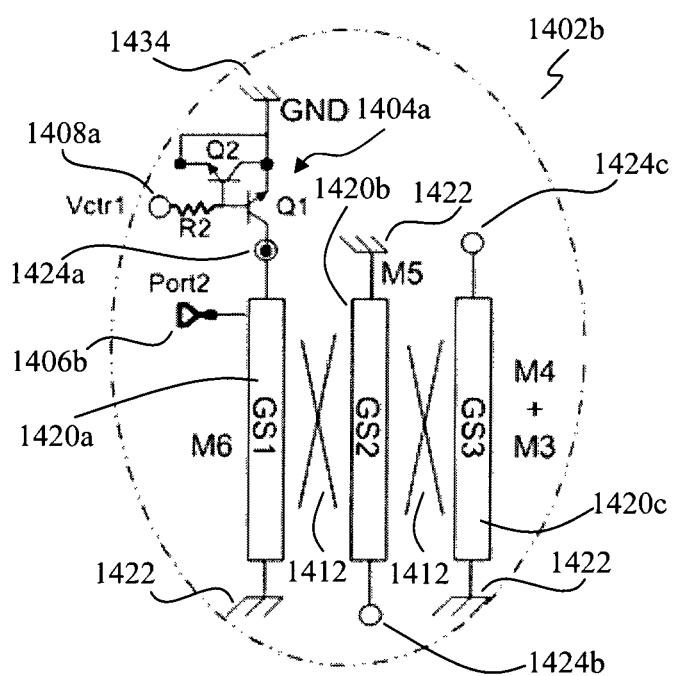

The standing-wave switch 1300 may be employed as a standing-wave Tx/Rx (transmit/receive) switch. Switchable artificial resonators may be further extended for a Tx/Rx switch design with filtering response. A further non-limiting example of a standing-wave Tx/Rx switch may be as illustrated in FIGS. 14A and 14B. However, it should be appreciated that other architectures may be provided for the switch to be employed as a standing-wave Tx/Rx switch.

FIG. 14A illustrates a topology of a Tx/Rx Single-Pole-Double-Throw (SPDT) switch 1400 with switchable artificial resonators (SARs). The switch 1400 may include a plurality of composite loaded lines, in the form of switchable artificial resonators (SARs). For illustration purposes, three SARs 1402a, 1402b, 1402b are shown in FIG. 14A and the switch 1400 will be described based on such topology. The three switchable artificial resonators, i.e. SAR1 1402a, SAR2 1402b and SAR3 1402c are used to form the SPDT switch 1400. However, it should be appreciated that any number of SARs may be employed. The design of each SAR may be similar to that of the SPST switch 1300.

The switch 1400 may include three input/output ports (e.g. Port1 1406a, Port2 1406b and Port3 1406c) coupled respectively to the first SAR (SAR1) 1402a, second SAR (SAR2) 1402b and third SAR (SAR3) 1402c. An input signal (e.g. RF signal) may be received via either Port1 1406a, Port2 1406b or Port3 1406c. The switch 1400 may further include two transistor/diode (T/D) networks, where one T/D network (illustrated as a transistor group Qa in FIG. 14A) 1404a is coupled between the second SAR 1402a and ground (GND) 1434, and another T/D network (illustrated as a transistor group Qb in FIG. 14A) 1404c is coupled between the third SAR 1402c and ground (GND) 1434. The switch 1400 may further include nodes 1408a, 1408c, which may be connected to a control circuit (not shown) which may provide a control signal, Vctr1, to the transistor/diode (T/D) network 1404a to control the operation of the T/D network 1404a, and control signal, Vctr2, to the transistor/diode (T/D) network 1404c to control the operation of the T/D network 1404c.

There may be coupling, as represented by "X" 1412, between or among the different SARs 1402a, 1402b, 1402c. The coupling may be electrical coupling, magnetic coupling or both, which may be implemented using one or more inductors, one or more capacitors or any combination thereof. The coupling may be as illustrated in FIG. 2C. For example, at least one capacitive element (e.g. a capacitor) may be provided between adjacent SARs to effect electrical coupling, while at least one inductive element (e.g. an inductor) may be provided between adjacent SARs to effect magnetic coupling. Further, at least one capacitive element and at least one inductive element may be connected in series or in parallel to each other between adjacent SARs to effect electrical and magnetic coupling.

FIG. 14B shows a schematic diagram of the second SAR 1402b of FIG. 14A, and which may also be applicable to the third SAR 1402c. The second SAR 1402b may include a plurality of transmission lines, in the form of ground stubs. For illustration purposes, three ground stubs are shown in FIG. 14B and the switch 1400 will be described based on such topology. The second SAR 1402b may include a first ground stub (GS1) 1420a, a second ground stub (GS2) 1420b, and a third ground stub (GS3) 1420c. Port2 1406a may be coupled to the first ground stub 1420a. There may be coupling, as represented by "X" 1412, between or among the different ground stubs 1420a, 1420b, 1420c, which may be as described above in the context of coupling, as represented by "X" 1412, between or among the different SARs 1402a, 1402b, 1402c. The ground stubs 1420a, 1420b, 1420c inside each switchable artificial resonator may be strongly coupled among each other.

In various embodiments, the three ground stubs 1420a, 1420b, 1420c used in the switchable artificial resonators may be defined in metal layers M6, M5 and a combination of metal layers M4 and M3 (M4+M3), respectively. The three ground stubs (GS1, GS2 and GS3) 1320a, 1320b, 1320c, which may be inter-digitally coupled to each other in broadside, may be employed to form or define the second SAR 1402b. By employing a plurality of transmission lines or ground stubs 1420a, 1420b, 1420c coupled to each other, the second SAR 1402b may be much shorter and may have a lower loss as compared to the smallest transmission line resonator of a quarter-wavelength. The total effect of each switchable artificial resonator is equivalent to a resonator with a physical length much less than that of the smallest transmission line resonator—a quarter-wave length resonator.

As shown in FIG. 14B, a first end of the first ground stub 1420a may be connected to ground (e.g. a "short" end) 1422, while a second end of the first ground stub 1420a may be connected to a node 1424a. Similarly, respective first ends of the ground stubs 1420b, 1420c may be connected to ground (e.g. "short" ends) 1422 while the respective second ends of the ground stubs 1420b, 1420c may be connected to respective nodes 1424b, 1424c, as open ends. The node 1424a may be connected to the T/D network 1404a, while the nodes 1424b, 1424c may be left as open. The T/D network 1404a may be coupled between the first ground stub 1420a and ground (GND) 1434. The T/D network 1404a may also be coupled to the node 1408a of the switch 1400, which may be connected to a control circuit (not shown) which may provide a control signal, Vctr1, to the T/D network 1404a to control the operation of the T/D network 1404a, for example to switch the T/D network 1404a between an "on" status or an "off" status.

The T/D network 1404a may include two transistors (e.g. npn transistors, e.g. BJT transistor LN232) and a resistor. The T/D network 1404a may include a transistor Q1 having a collector (C) terminal connected to the node 1424a and an emitter (E) terminal that is connected to the emitter (E) terminal and the collector (C) terminal of the transistor Q2 as well as to ground (GND) 1434. The base (B) terminals of the transistors Q1, Q2 may be coupled together and connected to the node 1408a via a base resistor, R2. Therefore, the open end of the first ground stub 1420a may be connected to transistors Q1, Q2. It should be appreciated that the transistor Q2 may be a dummy transistor. The transistors Q1, Q2 may be employed to control the "on" and "off" status of the T/D network 1404a as well as the corresponding status of the switch 1400.

As illustrated in FIG. 14A, the first SAR 1402a is not connected to a transistor or a T/D network. In other words, the first SAR 1402a is always "on".

The operation of the standing-wave switch 1400 may be as follows: when the control signal Vctr1 is high and the control signal Vctr2 is low, the transistor group Qa (having transistors Q1, Q2) may be "on" while the transistor group Qb may be "off". A input RF signal may be fed to the first SAR 1402a and coupled into the third SAR 1402c in the frequency range of interest and thus the switch path from Port1 1406a to Port3 1406c may be on or activated. At this condition, the second SAR 1402b is off or not activated in the frequency range of interest. Vice versa, when the control signal Vctr1 is low and the control signal Vctr2 is high, the switching path from Port1 1406a to Port2 1406b may be on activated while the switch path from Port1 1406a to Port3 1406c is off or not activated.

FIGS. 13A, 14A and 14B show how the transmission branch (ground stubs (GS) such as GS1, GS2 and GS3) may be connected to the associated transistors and how switches may be formed.

Various embodiments may provide a standing-wave switch (SWS) implementation method, which may have less or even no dependence on the transistors' equivalent on-resistance in the switch. Thus, it may be possible to achieve very low insertion loss for high frequency applications.

Figure 16A:
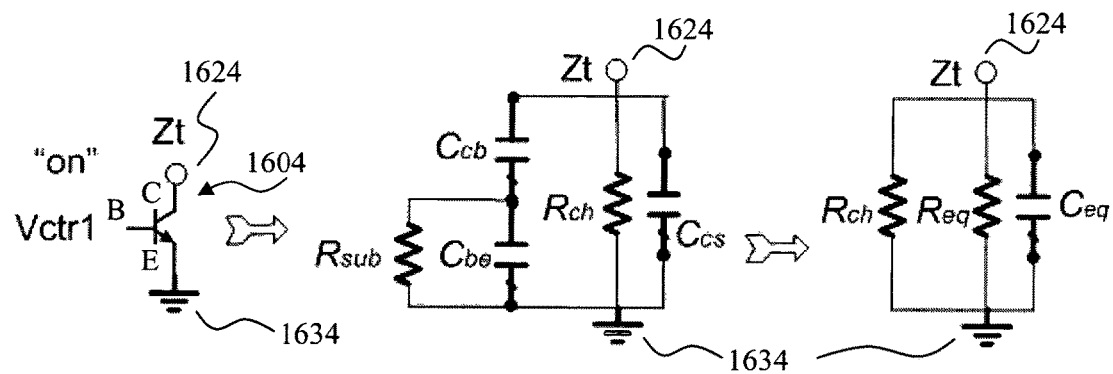
FIGS. 16A and 16B show schematic diagrams of transistor modeling used for the switches of various embodiments.
Figure 16B:
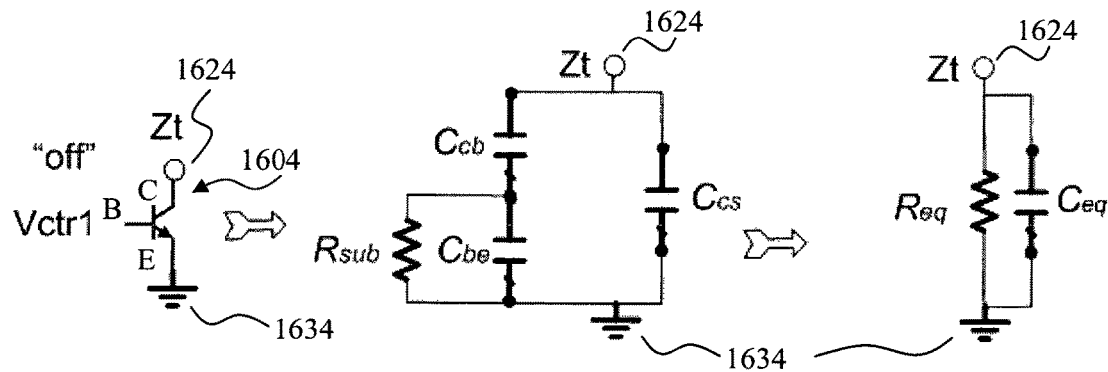

Using the embodiments of FIGS. 13A, 14A and 14B as non-limiting examples, as the ground stub operates in the standing-wave status, the open end, which is connected with the collector terminal of the transistor, has a maximum absolute voltage Vmax. The absolute voltage drop between the collector terminal and the grounded emitter may also be Vmax. FIGS. 16A and 16B show schematic diagrams of transistor modeling used for the switches of various embodiments, illustrating simplified equivalent circuits of an emitter grounded BJT transistor. FIG. 16A illustrates the equivalent circuits when the transistor 1604 is "on" while FIG. 16B illustrates the equivalent circuits when the transistor 1604 is "off". The collector (C) terminal of the transistor 1604 may be connected to a node 1624, the emitter (E) terminal of the transistor 1604 may be connected to ground 1634 while the base (B) terminal of the transistor 1604 may receive a control signal, Vctr1. The term "Rsub" may refer to the substrate resistance, the term "Rch" may refer to the channel resistance, the term "Ccb" may refer to the capacitance between the collector terminal and the base terminal of the transistor 1604, the term "Cbe" may refer to the capacitance between the emitter terminal and the base terminal of the transistor 1604, while the term "Ccs" may refer to the capacitance between the collector terminal of the transistor 1604 and the substrate. For high frequency applications, a consideration of the switch transistor 1604 may include the parasitic capacitance and the resistance. The parasitic base-to-emitter capacitance, Cbe, which is the sum of the depletion capacitance of the base-emitter junction and the diffusion capacitance, and the depletion capacitance Ccb of the collector-base junction, are the two major parasitic capacitances. Another large capacitor Ccs, which is larger than either Ccb (collector-base junction capacitance) or Cbe (collector-emitter junction capacitance), models the capacitance of the collector-substrate junction. Since the impedance of the junction capacitance is very low at millimeter-wave frequencies, the substrate resistance network from the junction to the substrate ground is may be an issue.

According to the transistor parasitic circuit in FIGS. 16A and 16B, for the same input power, the power dissipation, $P_{dis1}$ and $P_{dis2}$, of the transistor may be written as $$P_{dis1} = \frac{V_{max}^2}{2R_{eq}}, \text{ when the transistor is "off",} \quad \text{(Equation 1)}$$

$$P_{dis2} = \frac{(R_{eq} + R_{ch})V_{max}^2}{2R_{eq}R_{ch}}, \text{ when the transistor is "on",} \quad \text{(Equation 2)}$$

where $R_{eq}$ refers to the equivalent resistance and $R_{ch}$ refers to the channel resistance. The equivalent resistance, $R_{eq}$, and the equivalent capacitance, $C_{eq}$, may be determined as follows $$R_{eq} = \frac{4\omega^2 R_{sub}^2 C_j^2 + 1}{\omega^2 R_{sub} C_j^2}, \quad \text{(Equation 3)}$$

$$C_{eq} = \frac{C_j + 2\omega^2 R_{sub}^2 C_j^3}{4\omega^2 R_{sub}^2 C_j^2 + 1} + C_s. \quad \text{(Equation 4)}$$

It may be observed that for a same voltage, Vmax (the breakdown voltage for a selected transistor may be about 2.2 V), as $R_{eq} \gg (R_{eq}//R_{ch})$ (where "$R_{eq}//R_{ch}$" refers to a resistance equivalent to a combination of the resistances $R_{eq}$ and $R_{ch}$ in parallel, and where the calculated $R_{eq}$ and "$R_{eq}//R_{ch}$" are about 438Ω and about 7Ω respectively for a LN232 10.16 μm transistor), $P_{dis1}$ (about 5.5 mW)$\ll P_{dis2}$ (about 344 mW), where $P_{dis1}$ corresponds to the status of "off" transistor and "on" switch, while $P_{dis2}$ corresponds to the status of "on" transistor and "off" switch. When the switch input RF power is increased, the voltage on the transistor may be increased. It may be observed that in the transistor "off" status, the transistor may have much high power handling capability due to the smaller power dissipation at the same voltage. According to Equations 1 and 2, $P_{dis1}$ and $P_{dis2}$ may also be increased with the relationship of $P_{dis1} \ll P_{dis2}$. For the same RF input power (e.g. RF breakdown power), the power dissipation across the transistor in the "on" or "off" paths may determine the breakdown powers (or handling power) of the switch as $$P_{bon} = \frac{V_{bon}^2}{2R_{eq}}, \quad \text{(Equation 5)}$$

$$P_{bof} = 10^{\left(\frac{ISO}{10}\right)} \frac{V_{bof}^2}{2(R_{eq}//R_{ch})}, \quad \text{(Equation 6)}$$

where $P_{bon}$ refers to the breakdown power when the switch is in an "on" path and $P_{bof}$ refers to the breakdown power when the switch is in an "off" path.

For the breakdown power, $P_{bof}$, in a switch "off" path, the switch isolation (ISO) may decrease the delivering power to the switch "off" path, thus increasing the power handling $P_{bof}$ as given in Equation 6 (e.g. for a switch with approximately 20 dB ISO, $P_{bof}=100P_{dis}$@broken). From Equations 5 and 6, it is clear that for the same input RF power, the power dissipation across the transistors of switches of various embodiments may be much less than conventional switches. It is also clear that the switchable artificial resonator-based switch of various embodiments may have a higher P1 dB (where P1 dB refers to the 1 dB compression point) and power handling capability for a filtering switch operation.

Figure 15A:
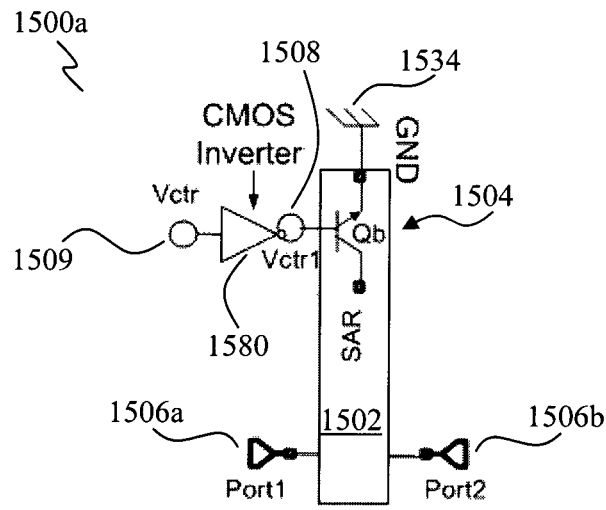
FIGS. 15A and 15B show schematic diagrams of respective standing-wave switches, according to various embodiments.

FIG. 15A shows a schematic diagram of a standing-wave switch 1500a, according to various embodiments, illustrating a topology of a Single-Pole-Single-Throw (SPST) standing-wave switch. The switch 1500a may include one (set of) composite loaded lines 1502, in the form of a switchable artificial resonator (SAR), two input/output ports (e.g. Port1 1506a and Port2 1506b) coupled to the SAR 1502, at least one transistor/diode (T/D) network (illustrated as a transistor group Qb) 1504 coupled between the SAR 1502 and ground (GND) 1534, as well as a node 1508, where these elements or features may be as described in the context of the corresponding features of the embodiment of FIG. 13A. The switch 1500a may further include an inverter (e.g. a CMOS inverter) 1580 connected between the node 1508 and another node 1509. A signal, Vctr, may be applied to the node 1509 connected to an input side of the inverter 1580, which may then be inverted by the inverter 1580 to form a signal, Vctr1, to be applied to the transistor/diode (T/D) network 1504 via the node 1508 connected to an output side of the inverter 1580.

Figure 15B:
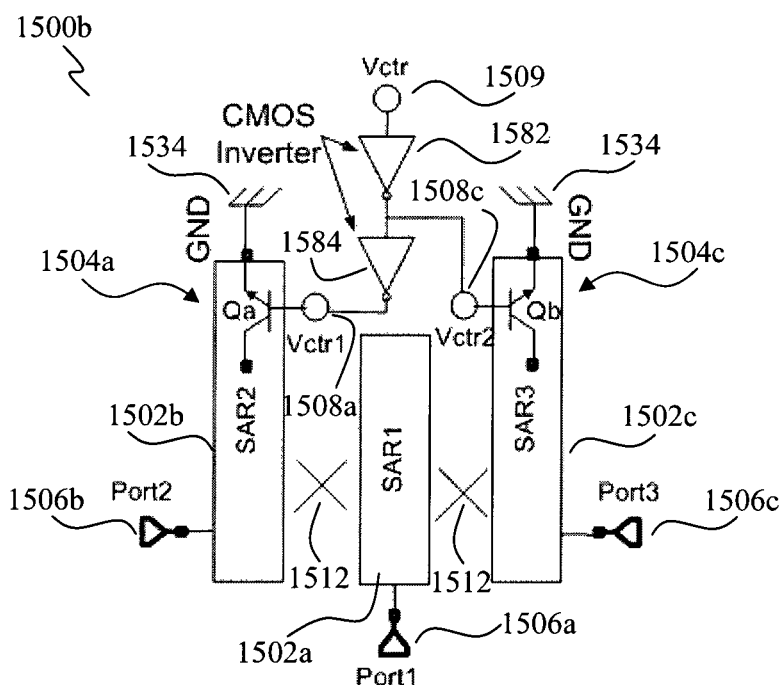

FIG. 15B shows a schematic diagram of a standing-wave switch 1500b, according to various embodiments, illustrating a topology of a Single-Pole-Double-Throw (SPDT) standing-wave switch. The switch 1500b may include a plurality of composite loaded lines 1502a, 1502b, 1502c, in the form of switchable artificial resonators (SARs), with coupling (represented by "X") 1512) to each other, three input/output ports (e.g. Port1 1506a, Port2 1506b, Port3 1506c), a T/D network (illustrated as a transistor group Qa in FIG. 15) 1504a coupled between the second SAR 1502a and ground (GND) 1534, and another T/D network (illustrated as a transistor group Qb in FIG. 15A) 1504c coupled between the third SAR 1502c and ground (GND) 1434, as well as nodes 1508a, 1508c, where these elements or features may be as described in the context of the corresponding features of the embodiments of FIGS. 14A and 14B.

The switch 1500b may further include two inverters (e.g. CMOS inverters) 1582, 1584 connected to the nodes 1508a, 1508c, 1509. An input side of the inverter 1582 is connected to the node 1509, an output side of the inverter 1584 is connected to the node 1508a, while the node 1508c is connected to an intersection between the two converters 1582, 1584. A signal, Vctr, may be applied to the node 1509, which may then be inverted by the inverter 1582 to form a signal, Vctr2, to be applied to the transistor/diode (T/D) network 1504c via the node 1508c, and further inverted by the inverter 1584 to form a signal, Vctr1, to be applied to the transistor/diode (T/D) network 1504a via the node 1508a.

As described above, various embodiments of the switch may employ multiple transmission lines or resonators, for example λ/2 and/or λ/4 resonators to form one (set of) composite loaded lines or artificial resonator, which may provide a much compact size and low loss. The multiple resonators may be coupled to each other, by at least one of electric coupling or magnetic coupling, to form a standing wave resonator. The multiple resonators may be connected to one or more transistor/diode (T/D) networks, and thus the power handling capability may be improved and the insertion loss may be reduced. At least one PIN diode or at least one transistor may be employed in each T/D network for the switch applications.

Various embodiments may provide the following features:

A standing-wave switch (SWS) which may be applicable for different types of RF/Microwave/Millimeter-wave switches, for example based on single-pole-single-throw (SPST) or single-pole-double-throw (SPDT) as shown in FIGS. 2A and 2B respectively. The standing-wave switch may include composite loaded lines or multiple-coupled composite loaded lines and at least one transistor/diode network. Further, the standing-wave switch may be of single-pole-multiple-throw types.

The composite loaded lines may be a single or multiple-coupled quarter-wave-length periodic or non-periodic loaded transmission lines resonators or their modified resonators with capacitor loaded at the open-end. The open end side of the quarter-wave length resonator or its' modified resonator may or may not connect to a transistor/diode network. If not connected to the diode/transistor network, it may be open or connected to one or more capacitors. This may mean that the open end sides of some resonators may not connect to a T/D network, but at least one open end of the multiple resonators is connected to a T/D network. The resonator not connected to a T/D network may be open or connected to capacitors.

The composite loaded lines may be replaced by inductors, a transformer or multiple-port transformers with one end connected to the ground and the other end connected to the diode/transistor network.

While various embodiments of the standing-wave switch have been described based on quarter-wave standing-wave switches and the figures illustrate some types of the quarter-wave standing-wave switches due to their compact size, the principle or concept of various embodiments may also be applicable to half-wavelength standing-wave switches or above mode standing-wave switches.

In various embodiments, the composite loaded lines may also be distributed microwave transmission lines such as microstrips, coplanar waveguides, striplines, coplanar stripline (CPS), etc.

For forming the switches such as the embodiments illustrated in FIGS. 2A and 2B, the number of multiple composite loaded lines may be any integers. The number of the composite loaded lines provided may provide a tradeoff between the insertion loss and isolation. The coupling between/among the multiple composite loaded lines may be electric or magnetic coupling or their combinations.

The connection locations of the diode/transistor network may not necessary be to the end of the transmission lines or resonators as illustrated in the figures, and may be at any position along the transmission lines. Further, the input port and output ports may be connected to any positions of the composite loaded lines.

The transmission lines in the composite loaded lines may not be of a uniform format. The transmission lines may have different types of loading in the signal line or the ground planes. The loading may be a periodic or a non-periodic format.

The composite loaded lines itself may form different switches such as SPST and SPDT, etc. when the diode/transistor network is connected to different transmission lines inside of the composite loaded lines to form a network for the switch operation.

The ground ends of the quarter-wave resonators in the composite loaded lines may be interval or at one side to form different coupling types. This may mean that the multiple lines may be overlapped, side by side or at an interval.

The control (ctr) circuit, which is to apply a control voltage through the diode/transistor networks, may have a single line or multiple lines to control the diode and/or the transistor to the "on" or "off" status, and thus control the open-end side of the transmission line resonator to be at a short status or an open status.

The coupling between or among the (transmission) lines in the (set of) composite loaded lines or between or among the different (sets of) composite loaded lines may be electric or magnetic coupling or both of them. The coupling may also be replaced by one or more capacitors and/or one or more inductors.

The transistor/diode network may include different types of diodes, MEMS switches, transistors or their combination network. The transistor/diode network may include diodes, MEMS switches, transistor or their combination network connected with different types of capacitors in series or in parallel.

The diode(s) of the transistor/diode network may be of any type available and not limited PIN diodes, or with a resistor in series or in parallel with the diode or any combination, with or without control bits for tuning or programming.

The transistor(s) of the transistor/diode network may be of any type available and not limited to PMOS or NMOS or npn BJT or pnp BJT or a resistor in series or in parallel with the transistor or any combination, with or without control bits for tuning or programming. This may provide flexible connection to the transistors of diodes.

The NMOS transistor (e.g. NFET) of the transistor/diode network may be a single NMOS transistor or several NMOS transistors connected in parallel or in series with each other, as shown in FIGS. 9A to 9C. The NMOS transistors may not necessary be identical. The NMOS transistor network may be connected in parallel with a $C_p$ capacitor network to enhance the SWS switch isolation.

The $C_p$ capacitor network in the diode/transistor network may be a single capacitor or a capacitor network (e.g. having a plurality of capacitors), or may be a single capacitor or a capacitor network (e.g. having a plurality of capacitors) connected in series with a switch. The switch in the $C_p$ capacitor network may be "on" when the SWS switch is "off" to enhance isolation, while the switch in the $C_p$ capacitor network may be "OFF" when the SWS switch is "on" to reduce signal leakage to ground through the capacitor $C_p$ to reduce insertion loss.

The switch in the $C_p$ capacitor network may be the same type of the transistor/diode network described herein, or of other types.

The PMOS transistor (e.g. PFET) of the transistor/diode network may be a single PMOS transistor or several PMOS transistors connected in parallel or in series with each other, as shown in FIGS. 10A to 10C. The PMOS transistors may not necessary be identical. The PMOS transistor network may be connected in parallel with a $C_p$ capacitor network to enhance the SWS switch isolation.

The npn BJT (bipolar junction transistor) transistor of the transistor/diode network may be a single npn transistor or several npn transistors connected in parallel or in series with each other, as shown in FIGS. 11A to 11C. The npn transistors may not necessary be identical. The npn transistor network may be connected in parallel with a $C_p$ capacitor network to enhance the SWS switch isolation. The npn transistors may be replaced with pnp transistors with a slight circuit modification.

The transistor/diode network may be or may include an inductor connected in series with a capacitor, as shown in FIG. 12A. The inductor may be one or more spiral inductors, a transmission line or transformers, or their combination.

The transistor/diode network may be or may include a diode, or a diode in series with a transmission line, as shown in FIGS. 12B and 12C respectively. The diode may be connected in parallel with a $C_p$ capacitor network to enhance the SWS switch isolation.

The diode in the transistor/diode network may be a single diode or a diode network (e.g. having a plurality of diodes).

The transistor/diode network for the standing-wave switch of various embodiments may not be limited to the forms as presented in FIGS. 9A to 9D, 10A to 10C, 11A to 11C, and 12A to 12C. The transistor/diode network may be of or may include different types of diodes, MEMS switches, transistors, resistors, capacitors or their combination network.

The capacitors described herein may be any type of capacitors, including tunable varactors.

Various embodiments are not only applicable to IC (integrated circuit) based technologies such CMOS (complementary metal-oxide-semiconductor), MMIC (monolithic microwave integrated circuit), or MEMS (microelectromechanical systems), but may also be applicable to module leveled switches such as PCB (printed circuit board) based switch or coaxial switches.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A switching circuit comprising:
    a transmission line arrangement comprising a plurality of transmission lines coupled to each other by at least one of an electric coupling or a magnetic coupling; and
    at least one switching element arrangement coupled to at least one transmission line of the plurality of transmission lines,
    wherein, in a first mode of operation, the at least one switching element arrangement is configured in a first state,
    wherein, in a second mode of operation, the at least one switching element arrangement is configured in a second state, and
    wherein the transmission line arrangement is configured to, depending on whether the at least one switching element arrangement is configured in the first state or whether the at least one switching element arrangement is configured in the second state, generate a standing wave from an input signal received by the transmission line arrangement, the standing wave being coupled between at least some of the plurality of transmission lines through the at least one transmission line into an output signal,
    wherein the output signal is transmitted from the transmission line arrangement.

2. The switching circuit as claimed in claim 1, wherein, in the second mode of operation, the at least one transmission line is at least substantially non-transmissive to at least one of the input signal or the output signal.

3. The switching circuit as claimed in claim 1, wherein the at least one switching element arrangement is coupled between the at least one transmission line and ground.

4. The switching circuit as claimed in claim 1, wherein each transmission line comprises:
    an end side connected to ground; and
    a node,
    wherein the at least one switching element arrangement is coupled to at least one of the nodes, and
    wherein adjacent transmission lines of the plurality of transmission lines are arranged with their respective end sides arranged on a same side of the transmission line arrangement.

5. The switching circuit as claimed in claim 1, wherein each transmission line comprises:
    an end side connected to ground; and
    a node,
    wherein the at least one switching element arrangement is coupled to at least one of the nodes, and
    wherein adjacent transmission lines of the plurality of transmission lines are arranged with their respective end sides arranged on opposite sides of the transmission line arrangement.

6. The switching circuit as claimed in claim 1, further comprising:
    a plurality of switching element arrangements,
    wherein a first switching element arrangement of the plurality of switching element arrangements is coupled to one transmission line of the plurality of transmission lines, and
    wherein a second switching element arrangement of the plurality of switching element arrangements is coupled to another transmission line of the plurality of transmission lines.

7. The switching circuit as claimed in claim 1, wherein each transmission line of the plurality of transmission lines comprises a resonator.

8. The switching circuit as claimed in claim 7, wherein the resonator comprises a quarter-wavelength resonator or a half-wavelength resonator.

9. The switching circuit as claimed in claim 7, wherein the resonator comprises an inductor and capacitor (LC) resonant circuit.

10. The switching circuit as claimed in claim 1, wherein each transmission line of the plurality of transmission lines comprises an inductive element.

11. The switching circuit as claimed in claim 1, wherein the at least one switching element arrangement comprises at least one switching element comprising at least one of a capacitor, a varactor, a diode, a resistor, a switch or a transistor.

12. The switching circuit as claimed in claim 11, further comprising a capacitive element arrangement connected in parallel with the at least one switching element.

13. The switching circuit as claimed in claim 1, wherein the at least one switching element arrangement comprises a transistor comprising:
    a first terminal connected to ground or configured to receive a power supply voltage;
    a second terminal connected to the at least one transmission line; and
    a third terminal configured to receive a control signal,
    wherein the at least one switching element arrangement is configured to be in the first state or the second state in response to the control signal.

14. The switching circuit as claimed in claim 1, wherein the at least one switching element arrangement comprises at least two transistors connected in series, each transistor comprising:
    a first terminal;
    a second terminal; and
    a third terminal,
    wherein the first terminal of a first transistor of the at least two transistors is connected to ground, wherein the second terminal of a last transistor of the at least two transistors is connected to the at least one transmission line, wherein the respective third terminals are configured to receive a respective control signal, and wherein the at least one switching element arrangement is configured to be in the first state or the second state in response to the respective control signals.

15. The switching circuit as claimed in claim 1, wherein the at least one switching element arrangement comprises at least two transistors connected in series, each transistor comprising:
   a first terminal;
   a second terminal; and
   a third terminal,
   wherein the second terminal of a first transistor of the at least two transistors is connected to the at least one transmission line,
   wherein the first terminal of a last transistor of the at least two transistors is configured to receive a power supply voltage,
   wherein the respective third terminals are configured to receive a respective control signal, and
   wherein the at least one switching element arrangement is configured to be in the first state or the second state in response to the respective control signals.

16. The switching circuit as claimed in claim 1, wherein the at least one switching element arrangement comprises at least two transistors connected in parallel, each transistor comprising:
   a first terminal;
   a second terminal; and
   a third terminal,
   wherein the first terminals of the at least two transistors are connected to ground or configured to receive a power supply voltage,
   wherein the second terminals of the at least two transistors are connected to the at least one transmission line,
   wherein the respective third terminals are configured to receive a respective control signal, and
   wherein the at least one switching element arrangement is configured to be in the first state or the second state in response to the respective control signals.

17. The switching circuit as claimed in claim 1, further comprising:
   at least two input or output ports coupled to the transmission line arrangement,
   wherein the input signal is received via one input or output port of the at least two input or output ports, and
   wherein the output signal is transmitted via another input or output port of the at least two input or output ports.

18. The switching circuit as claimed in claim 1, wherein the at least one switching element arrangement comprises an inductor connected in series with a capacitor, wherein the inductor and the capacitor are connected between the at least one transmission line and ground.

19. The switching circuit as claimed in claim 1, wherein the switching element arrangement comprises:
   a diode arrangement connected between the at least one transmission line and ground,
   wherein the at least one switching element arrangement is configured to be in the first state or the second state in response to a biasing voltage applied to the diode arrangement.

20. A transceiver comprising a switching circuit as claimed in claim 1.

* * * * *